(12) United States Patent
Li et al.

(10) Patent No.: US 9,595,317 B2
(45) Date of Patent: Mar. 14, 2017

(54) MULTI-STATE PROGRAMMING FOR NON-VOLATILE MEMORY

(71) Applicant: SanDisk Technologies Inc., Plano, TX (US)

(72) Inventors: Yen-Lung Li, San Jose, CA (US); Raul-Adrian Cernea, Santa Clara, CA (US); Jong Hak Yuh, Pleasanton, CA (US); Tai-Yuan Tseng, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/929,156

(22) Filed: Oct. 30, 2015

(65) Prior Publication Data

US 2016/0351254 A1 Dec. 1, 2016

Related U.S. Application Data

(60) Provisional application No. 62/167,428, filed on May 28, 2015.

(51) Int. Cl.
| | |
|---|---|
| *G11C 16/10* | (2006.01) |
| *G11C 11/56* | (2006.01) |
| *G11C 16/24* | (2006.01) |
| *G11C 16/04* | (2006.01) |

(52) U.S. Cl.
CPC ...... *G11C 11/5628* (2013.01); *G11C 11/5642* (2013.01); *G11C 16/0483* (2013.01); *G11C 16/10* (2013.01); *G11C 16/24* (2013.01); *G11C 16/107* (2013.01); *G11C 2211/5622* (2013.01)

(58) Field of Classification Search
CPC ...................................................... G11C 16/10
USPC ......................................................... 365/185.28
See application file for complete search history.

(56) References Cited

U.S. PATENT DOCUMENTS

| 6,714,457 | B1 | 3/2004 | Hsu et al. | |
|---|---|---|---|---|
| 7,599,224 | B2 * | 10/2009 | Lee .................... | G11C 11/5628 365/185.17 |
| 7,630,237 | B2 * | 12/2009 | Mokhlesi ............ | G11C 11/5628 365/185.03 |
| 8,274,838 | B2 * | 9/2012 | Dutta ................... | G11C 11/5628 365/185.03 |
| 2008/0113479 | A1 * | 5/2008 | Mokhlesi ............ | G11C 11/5628 438/266 |

(Continued)

OTHER PUBLICATIONS

International Search Report and Written Opinion dated Aug. 10, 2016 in International Patent Application No. PCT/US2016/033704.

*Primary Examiner* — Son Mai
(74) *Attorney, Agent, or Firm* — Vierra Magen Marcus LLP

(57) ABSTRACT

A method is provided for programming a non-volatile memory. The method includes programming memory cells for even bit lines by programming the memory cells into a plurality of intermediate data states from an erased state, and for each of the intermediate data states, concurrently programming the memory cells to a plurality of target data states. The method also includes programming memory cells for odd bit lines by programming the memory cells into the plurality of intermediate data states from an erased state, and for each of the intermediate data states, concurrently programming the memory cells to the plurality of target data states.

21 Claims, 19 Drawing Sheets

(56) References Cited

U.S. PATENT DOCUMENTS

| | | | |
|---|---|---|---|
| 2009/0010068 A1* | 1/2009 | Lee | G11C 11/5628 365/185.19 |
| 2009/0244977 A1* | 10/2009 | Mokhlesi | G11O 5/147 365/185.19 |
| 2010/0097863 A1* | 4/2010 | Kim | G11C 11/5628 365/185.18 |
| 2010/0124124 A1 | 5/2010 | Lee et al. | |
| 2010/0157678 A1* | 6/2010 | Mokhlesi | G11C 11/5628 365/185.17 |
| 2011/0145487 A1* | 6/2011 | Haratsch | G11C 7/02 711/103 |
| 2011/0305082 A1* | 12/2011 | Haratsch | G11C 7/02 365/185.03 |
| 2013/0223155 A1* | 8/2013 | Oowada | G11C 11/5642 365/185.22 |
| 2013/0301352 A1* | 11/2013 | Shim | G11C 16/10 365/185.03 |
| 2014/0016415 A1 | 1/2014 | Kamei et al. | |
| 2014/0063961 A1* | 3/2014 | Sakai | G11C 11/5628 365/185.17 |

\* cited by examiner

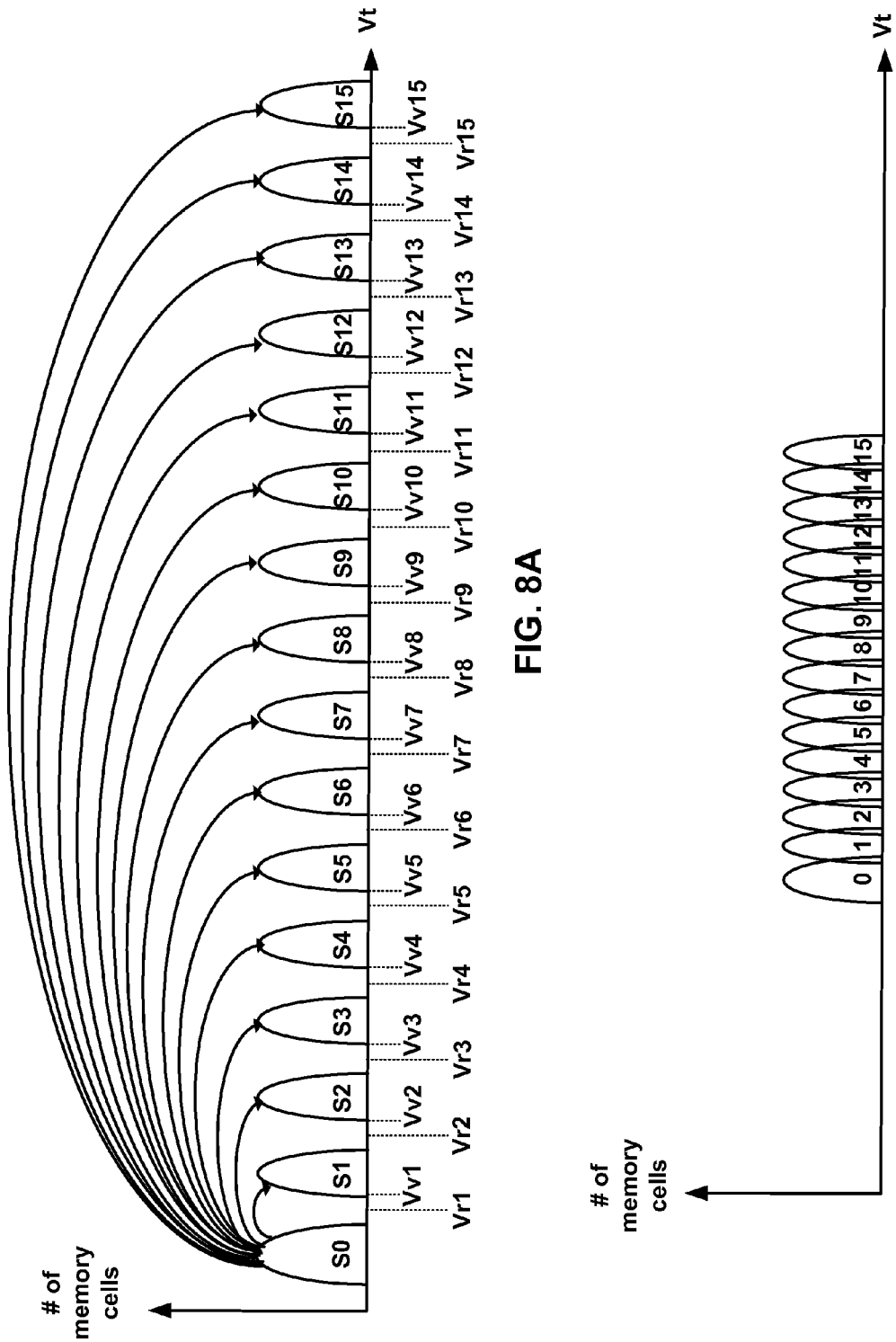

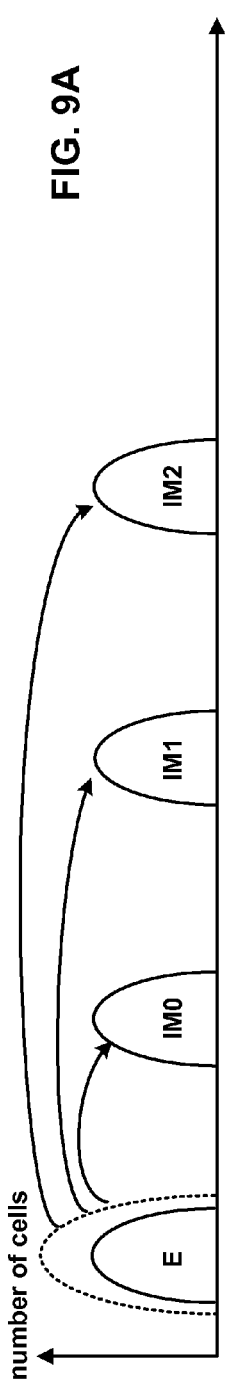
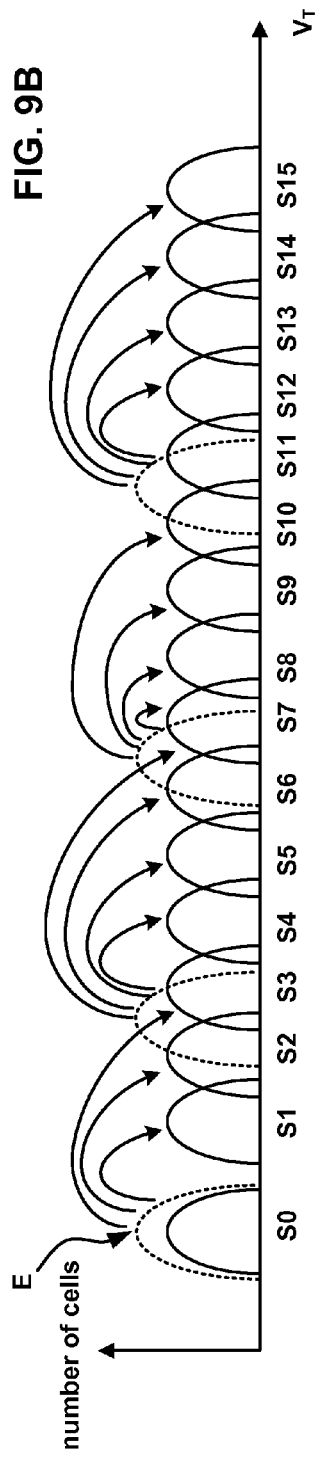
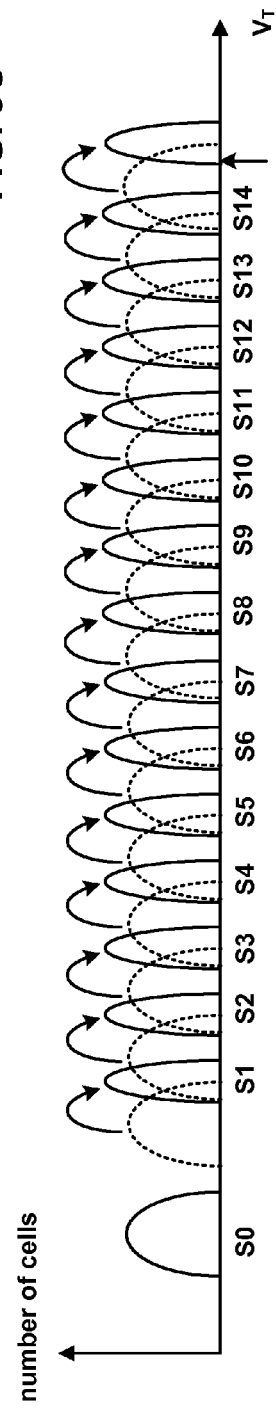

MULTI-STATE PROGRAMMING FOR NON-VOLATILE MEMORY

CROSS REFERENCE TO RELATED APPLICATIONS

This application claims the benefit of Provisional Application 62/167,428, "MULTI-STATE PROGRAMMING FOR THREE DIMENSIONAL NON-VOLATILE MEMORY," filed on May 28, 2015, incorporated herein by reference in its entirety for all purposes.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct range of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Publication No. 2004/0255090 both describe various data encoding schemes for multi-state flash memory cells. Although multi-state non-volatile memory can store more data than binary non-volatile memory, the process for programming and verifying the programming can take longer for multi-state non-volatile memory.

BRIEF DESCRIPTION OF THE DRAWINGS

Like-numbered elements refer to common components in the different figures.

FIGS. 8A and 8B depict threshold voltage distributions.

FIGS. 9A, 9B and 9C depict threshold voltage distributions.

DETAILED DESCRIPTION

Methods and apparatus are provided for concurrently programming memory cells from intermediate states to target data states. An example method includes programming memory cells for even bit lines by programming the memory cells into a plurality of intermediate data states from an erased state, and for each of the intermediate data states, concurrently programming the memory cells to a plurality of target data states. The method also includes programming memory cells for odd bit lines by programming the memory cells into the plurality of intermediate data states from an erased state, and for each of the intermediate data states, concurrently programming the memory cells to the plurality of target data states.

The following discussion provides details of one example of a suitable structure for a memory devices that can implement the proposed technology.

Figure 1:
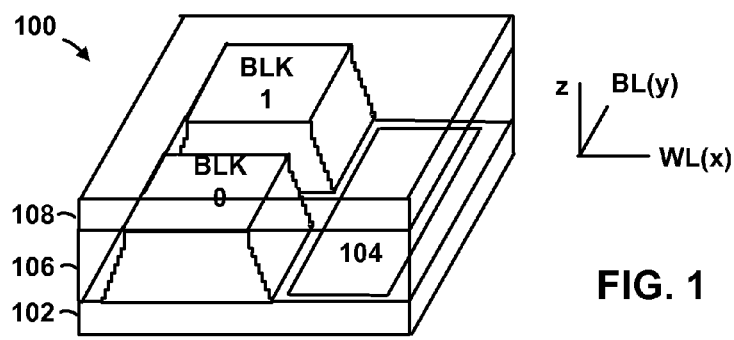
FIG. 1 is a perspective view of a 3D stacked non-volatile memory device.

FIG. 1 is a perspective view of a three dimensional (3D) stacked non-volatile memory device 100, which includes a substrate 102. On and above substrate 102 are example blocks BLK0 and BLK1 of memory cells (non-volatile storage elements). Also on substrate 102 is peripheral area 104 with support circuits for use by blocks BLK0 and BLK1. Substrate 102 also can carry circuits under the blocks, along with one or more lower metal layers which are patterned in conductive paths to carry signals of the circuits.

Blocks BLK0 and BLK1 are formed in an intermediate region 106 of memory device 100. In an upper region 108 of memory device 100, one or more upper metal layers are patterned in conductive paths to carry signals of the circuits. Each of blocks BLK0 and BLK1 includes a stacked area of memory cells, where alternating levels of the stack represent word lines. Although two blocks BLK0 and BLK1 are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
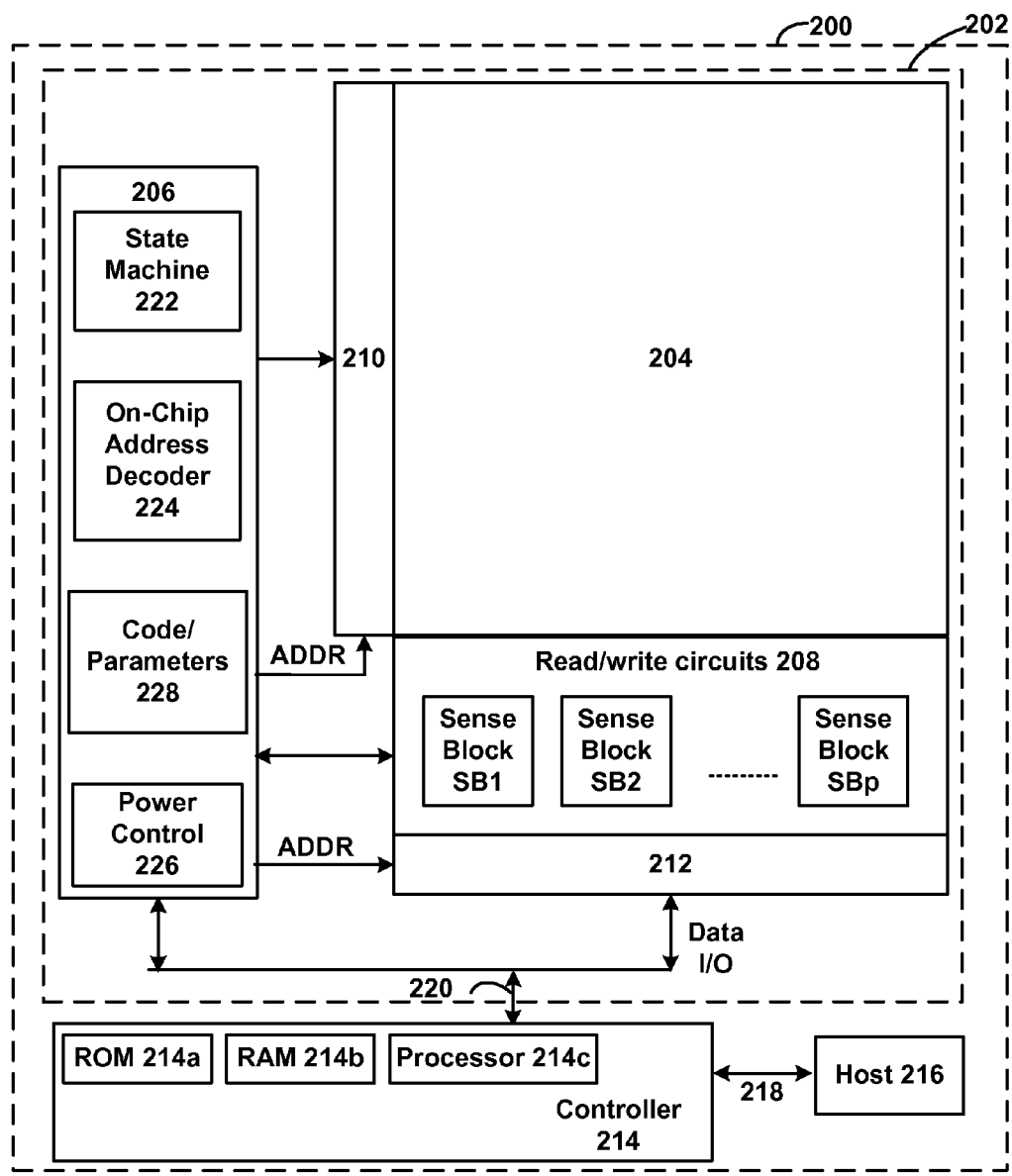
FIG. 2 is a functional block diagram of a memory device 200, which is an example of the 3D stacked non-volatile memory device 100 of FIG. 1.

FIG. 2 is a functional block diagram of an example memory device 200, which is an example of the 3D stacked non-volatile memory device 100 of FIG. 1. The components depicted in FIG. 2 are electrical circuits. Memory device 200 includes one or more memory die 202. Each memory die 202 includes a three dimensional memory structure 204 of memory cells (such as, for example, a 3D array of memory cells), control circuitry 206, and read/write circuits 208. In other embodiments, a two dimensional array of memory cells can be used.

Memory structure 204 is addressable by word lines via a row decoder 210 and by bit lines via a column decoder 212. Read/write circuits 208 include multiple sense blocks SB1, SB2, . . . , SBp (sensing circuitry) and allow a page of memory cells to be read or programmed in parallel. In some systems, a controller 214 is included in the same memory device 200 (e.g., a removable storage card) as the one or more memory die 202. However, in other systems, controller 214 can be separated from memory die 202.

In some embodiments, one controller 214 will communicate with multiple memory die 202. In other embodiments, each memory die 202 has its own controller. Commands and data are transferred between a host 216 and controller 214 via a data bus 218, and between controller 214 and the one or more memory die 202 via lines 220. In one embodiment, memory die 202 includes a set of input and/or output (I/O) pins that connect to lines 220.

Memory structure 204 may include one or more arrays of memory cells including a 3D array. Memory structure may 204 may include a monolithic three dimensional memory structure in which multiple memory levels are formed above (and not in) a single substrate, such as a wafer, with no intervening substrates. Memory structure 204 may include any type of non-volatile memory that is monolithically formed in one or more physical levels of arrays of memory cells having an active area disposed above a silicon substrate. Memory structure 204 may be in a non-volatile memory device having circuitry associated with the operation of the memory cells, whether the associated circuitry is above or within the substrate.

Control circuitry 206 cooperates with read/write circuits 208 to perform memory operations (e.g., erase, program, read, and others) on memory structure 204, and includes a state machine 222, an on-chip address decoder 224, and a power control module 226. State machine 222 provides chip-level control of memory operations. Code and parameter storage 228 may be provided for storing operational parameters and software. In one embodiment, state machine 222 is programmable by the software stored in code and parameter storage 228. In other embodiments, state machine 222 does not use software and is completely implemented in hardware (e.g., electronic circuits).

On-chip address decoder 224 provides an address interface between addresses used by host 216 or memory controller 214 to the hardware address used by decoders 210 and 212. Power control module 226 controls the power and voltages supplied to the word lines and bit lines during memory operations. Power control module 226 can include drivers for word line layers (discussed below) in a 3D configuration, select transistors (e.g., SGS and SGD transistors, described below) and source lines. Power control module 226 may include charge pumps for creating voltages. Sense blocks SB1, SB2, . . . , SBp include bit line drivers. An SGS transistor is a select gate transistor at a source end of a NAND string, and an SGD transistor is a select gate transistor at a drain end of a NAND string.

Any one or any combination of control circuitry 206, state machine 222, decoders 224/210/212, code and parameter storage 228, power control module 226, sense blocks SB1, SB2, . . . , SBp, read/write circuits 208, and controller 214 can be considered one or more control circuits that performs the functions described herein.

The (on-chip or off-chip) controller 214 may include storage devices (memory) such as ROM 214a and RAM 214b and a processor 214c. Storage devices ROM 214a and RAM 214b include code such as a set of instructions, and processor 214c is operable to execute the set of instructions to provide the functionality described herein. Alternatively or additionally, processor 214c can access code from a storage device in memory structure 204, such as a reserved area of memory cells connected to one or more word lines.

Multiple memory elements in memory structure 204 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level and other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
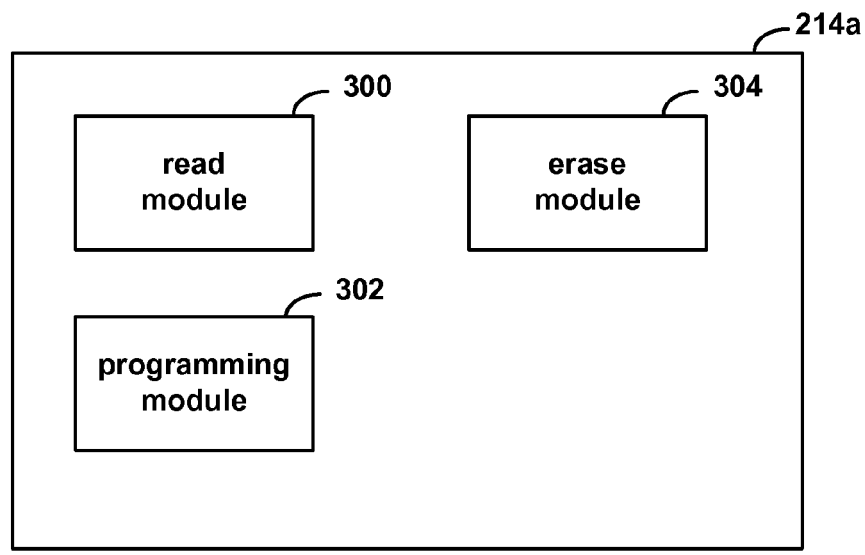
FIG. 3A is a block diagram depicting software modules for programming one or more processors in a controller.

FIG. 3A is a block diagram depicting software modules for programming one or more processors in controller 214 of FIG. 2. FIG. 3A depicts read module 300, programming module 302, and erase module 304 being stored in ROM 214a. These software modules also can be stored in RAM or memory die 202. Read module 300 includes software that programs processor(s) 214c to perform read operations. Programming module 302 includes software that programs processor(s) 214c to perform programming operations (including verification of programming). Erase module 304 includes software that programs processor(s) 214c to perform erase operations. Based on the software, controller 214 instructs memory die 202 to perform memory operations.

Figure 3B:
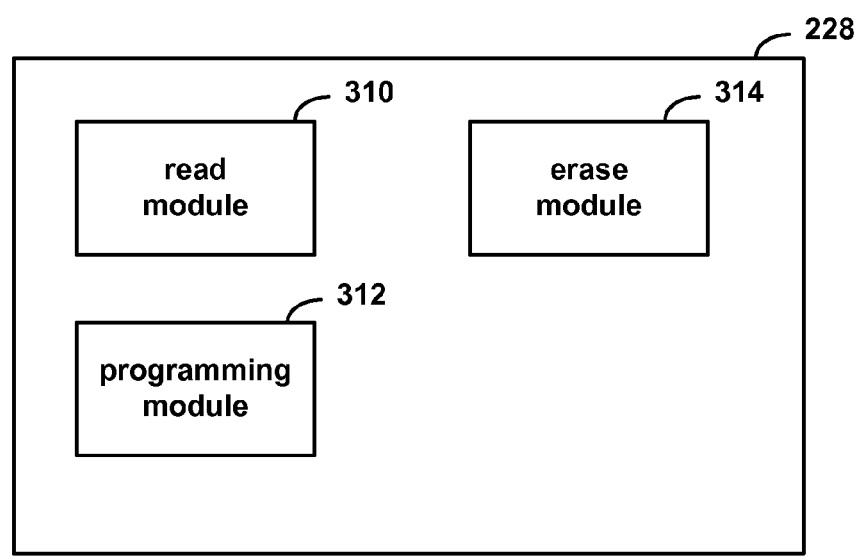
FIG. 3B is a block diagram depicting software modules for programming a state machine or other processor on a memory die.

FIG. 3B is a block diagram depicting software modules for programming state machine 222 of FIG. 2 (or other processor on memory die 202). FIG. 3B depicts read module 310, programming module 312, and erase module 314 being stored in code and parameter storage 228. These software modules can also be stored in RAM or in memory structure 204 of FIG. 2. Read module 310 includes software that programs state machine 222 to perform read operations. Programming module 302 includes software that programs state machine 222 to perform programming operations (including verification of programming). Erase module 304 includes software that programs state machine 222 to perform erase operations. Alternatively, state machine 222 (which is an electronic circuit) can be completely implemented with hardware so that no software is needed to perform these functions.

Figure 4A:
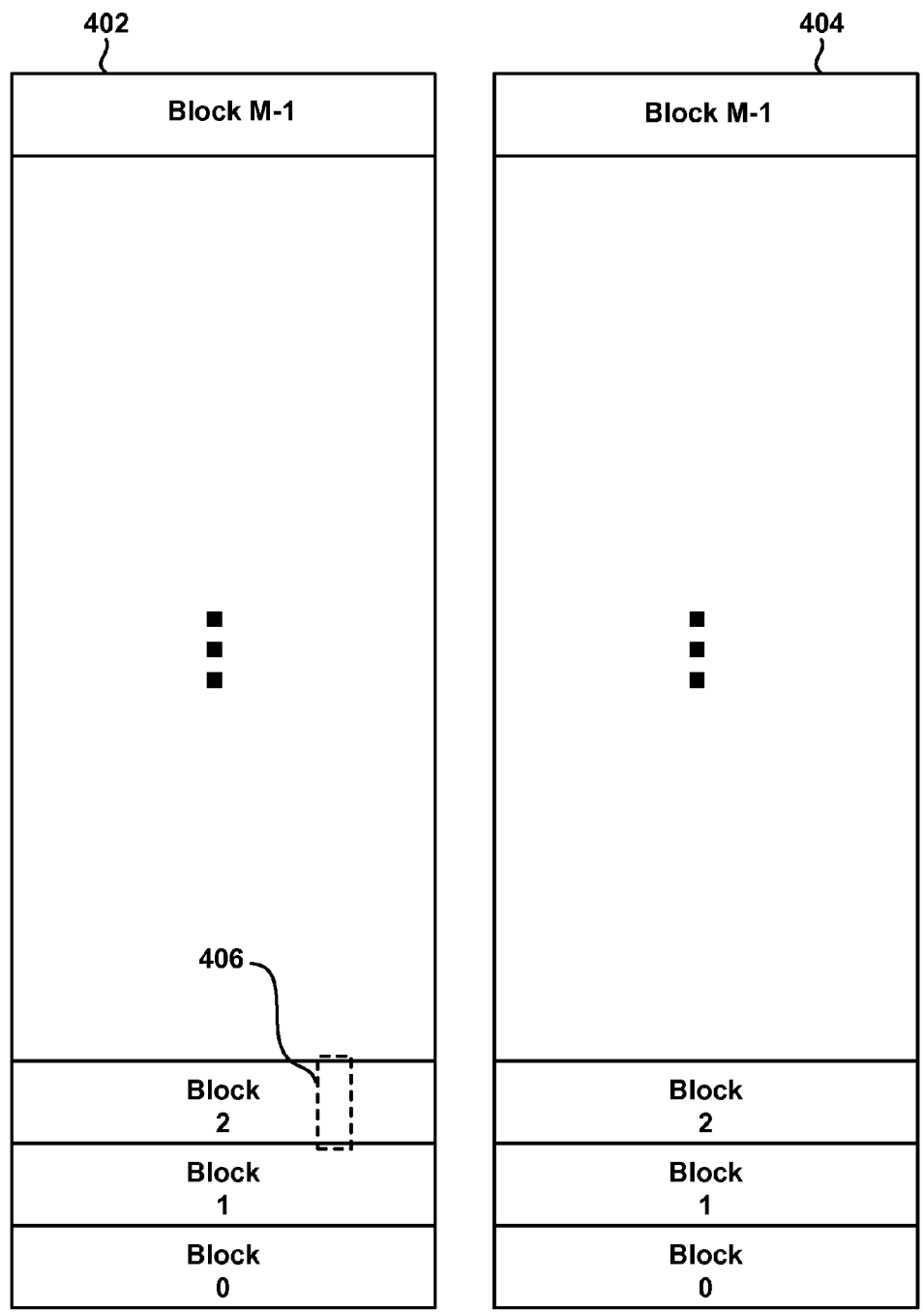
FIG. 4A is a block diagram of a memory structure having two planes.

FIG. 4A is a block diagram explaining one example organization of memory structure 204, which is divided into two planes 402 and 404. Each plane is then divided into M blocks. In one example, each plane has about 2000 blocks. However, different numbers of blocks and planes can also be used.

Figure 4B:
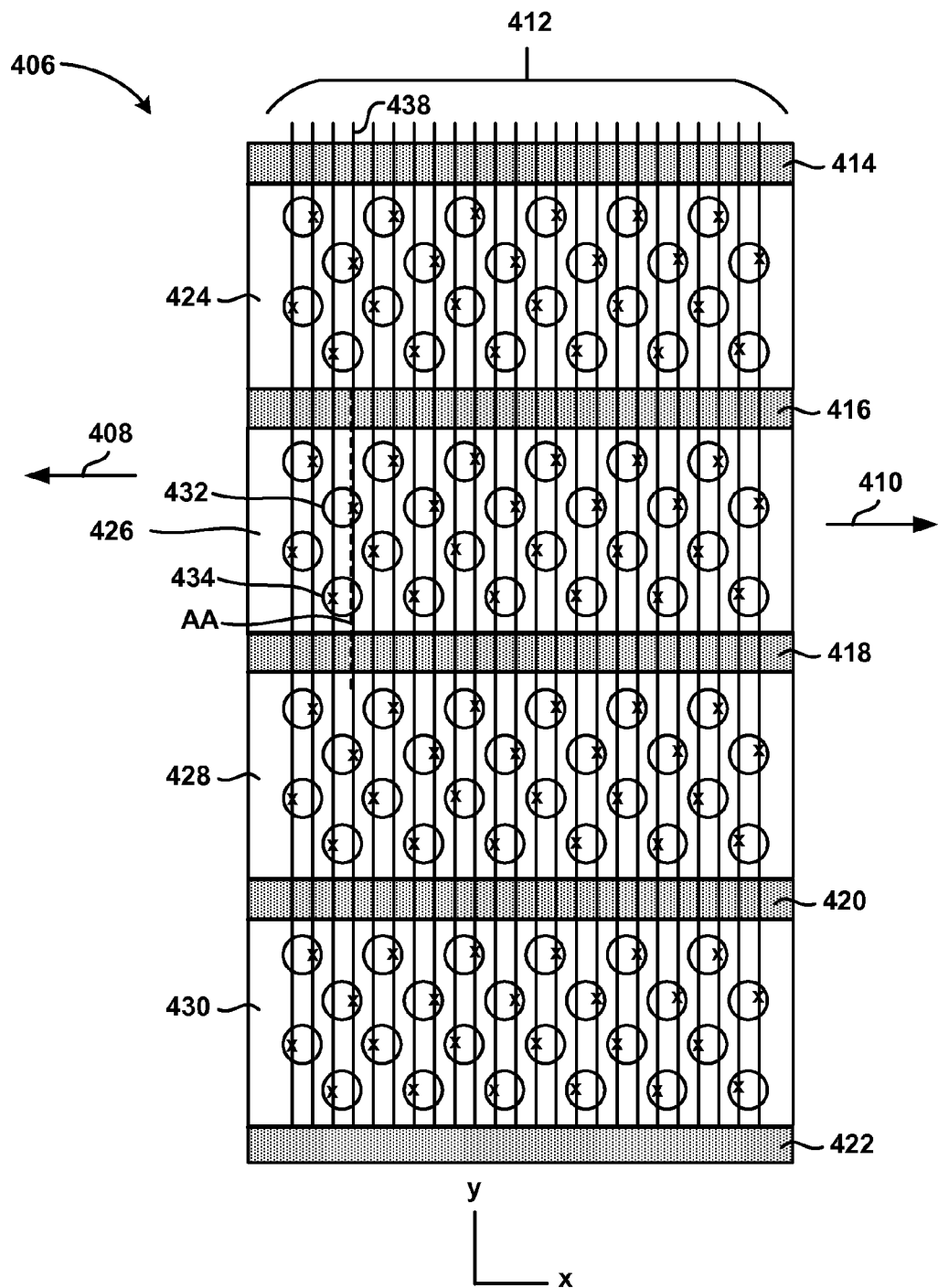
FIG. 4B is a top view of a portion of a block of memory cells.

FIGS. 4B-4E depict an example 3D NAND structure. FIG. 4B is a block diagram depicting a top view of a portion of one block from memory structure 204. The portion of the block depicted in FIG. 4B corresponds to portion 406 in block 2 of FIG. 4A. The block depicted in FIG. 4B extends in the direction of arrow 408 and in the direction of arrow 410. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Because the block depicted in FIG. 4B extends in the direction of arrow 408 and in the direction of arrow 410, the block includes more vertical columns than depicted in FIG. 4B FIG. 4B also depicts a set of bit lines 412. FIG. 4B shows twenty four bit lines because only a portion of the block is depicted. In other embodiments, more than twenty four bit lines are connected to vertical columns of the block. Each of the circles representing vertical columns has an "x" to indicate its connection to one bit line.

The block depicted in FIG. 4B includes a set of local interconnects 414, 416, 418, 420 and 422 that connect the various layers to a source line below the vertical columns. Local interconnects 414, 416, 418, 420 and 422 also serve to divide each layer of the block into four regions. For example, the top layer depicted in FIG. 4B is divided into regions 424, 426, 428 and 430.

In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together.

In one example implementation, a bit line only connects to one vertical column in each of regions 424, 426, 428 and 430. In that implementation, each block has sixteen rows of active columns and each bit line connects to four rows in each block. In one embodiment, all of four rows connected to a common bit line are connected to the same word line (via different word line fingers on the same level that are connected together). Therefore, the system uses the source select lines and the drain select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
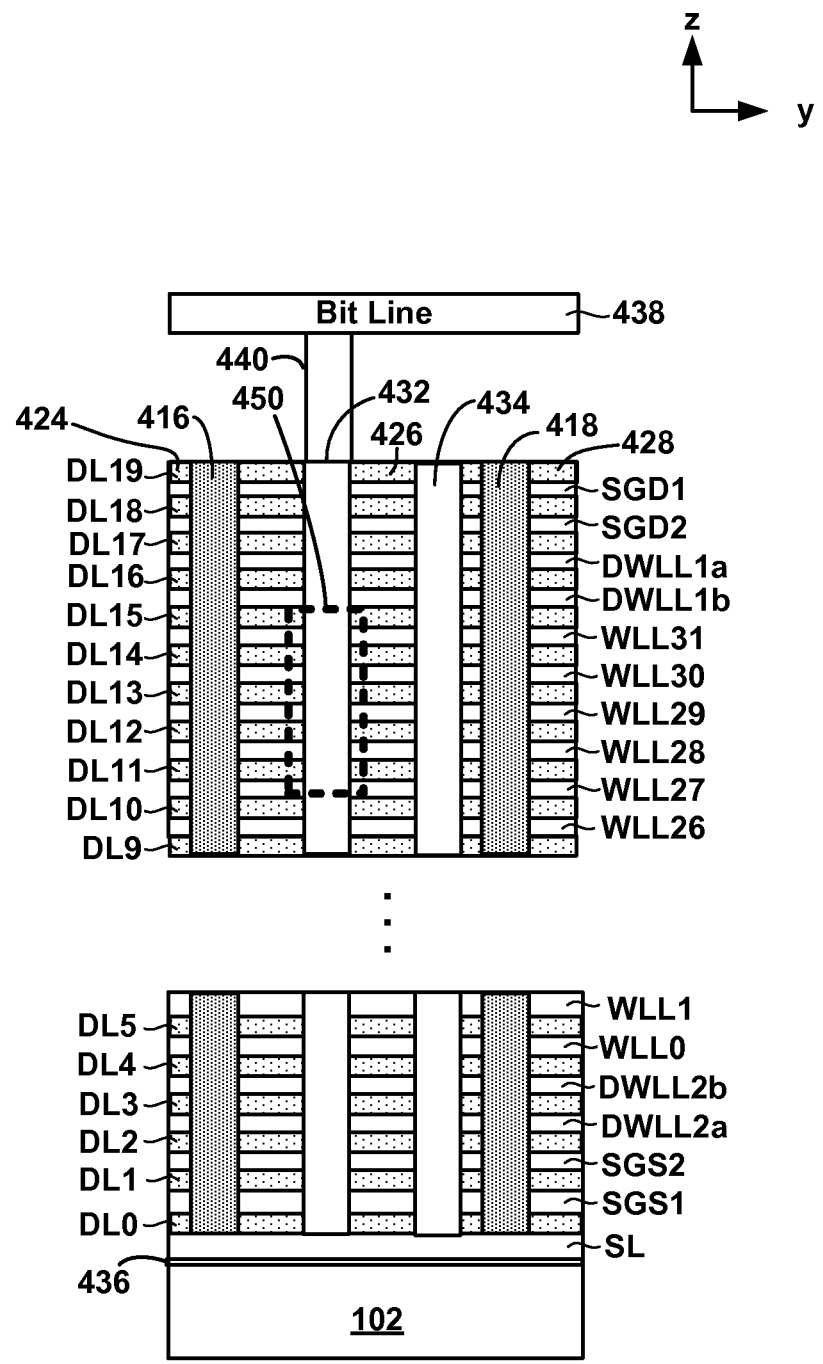
FIG. 4C is a cross-sectional view of a portion of a block of memory cells.

FIG. 4C depicts a portion of an embodiment of three dimensional memory structure 204 showing a cross-sectional view along line AA of FIG. 4B. This cross-sectional view cuts through vertical columns 432 and 434 and region 426 (see FIG. 4B). The structure of FIG. 4C includes two drain select layers (SGD1 and SGD1), two source select layers (SGS1 and SGS2), four dummy word line layers (DWLL1a, DWLL1b, DWLL2a and DWLL2b), and thirty two word line layers (WLL0-WLL31) for connecting to data memory cells. Other embodiments can implement more or less than two drain select layers, more or less than two source select layers, more or less than four dummy word line layers, and more or less than thirty two word line layers.

Vertical columns 432 and 434 are depicted protruding through the drain select layers, source select layers, dummy word line layers and word line layers. In one embodiment, each of vertical columns 432 and 434 comprises a NAND string. Vertical columns 432 and 434 and the layers listed below are disposed above substrate 102, an insulating film 436 on substrate 102, and a source line SL on insulating film 436. Vertical column 432 is connected to Bit Line 438 via connector 440. Local interconnects 416 and 418 are also depicted.

For ease of reference, drain select layers (SGD1 and SGD1), source select layers (SGS1 and SGS2), dummy word line layers (DWLL1a, DWLL1b, DWLL2a and DWLL2b), and word line layers (WLL0-WLL31) collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials.

Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, whereas a data memory cell is eligible to store user data. Thus, data memory cells may be programmed. Drain select layers SGD1 and SGD1 are used to electrically connect and disconnect NAND strings from bit lines. Source select layers SGS1 and SGS2 are used to electrically connect and disconnect NAND strings from the source line SL.

Figure 4D:
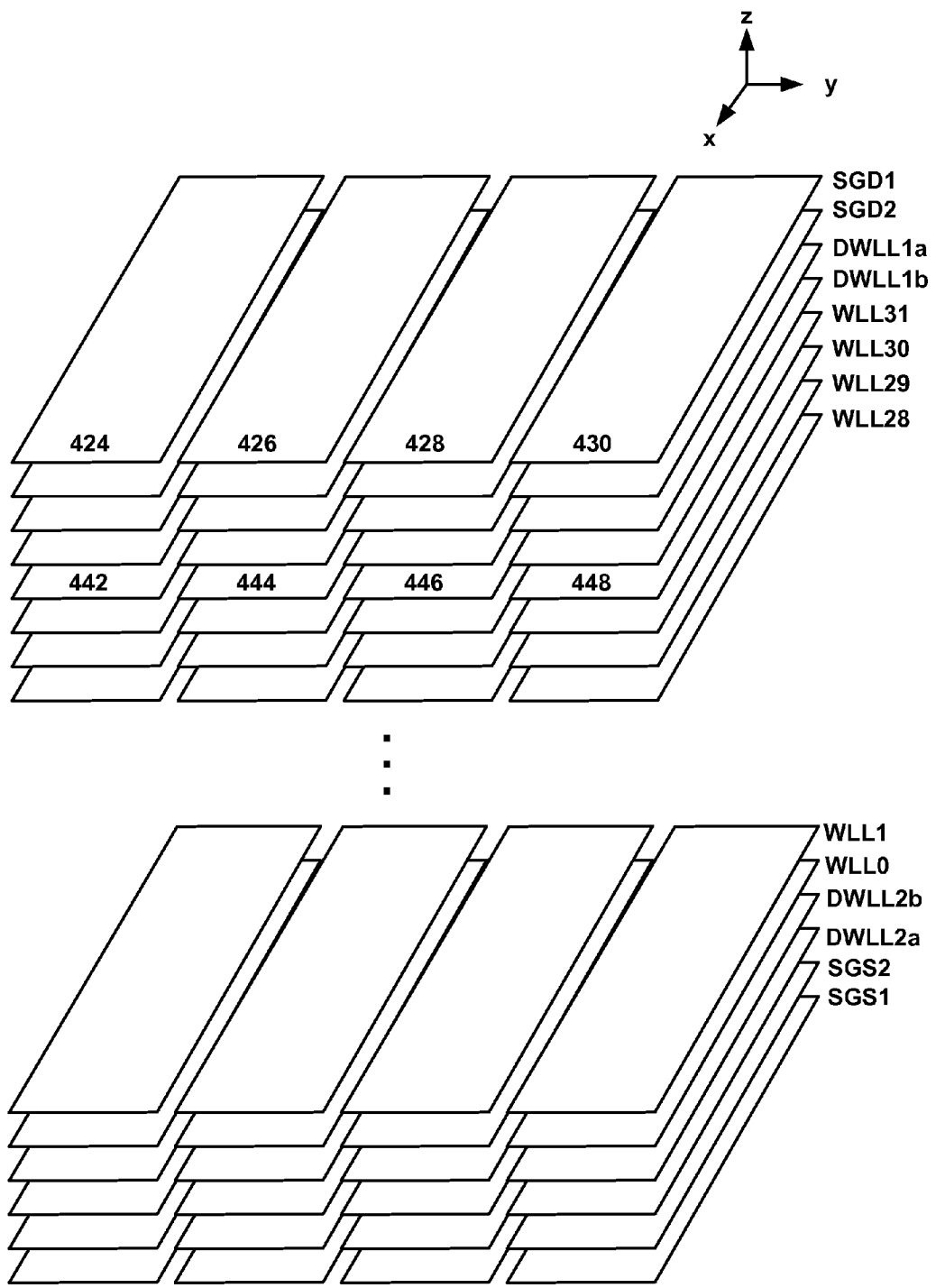
FIG. 4D is a view of the select gate layers and word line layers.

FIG. 4D depicts a perspective view of the conductive layers (SGD1, SGD1, SGS1, SGS2, DWLL1a, DWLL1b, DWLL2a, DWLL2b, and WLL0-WLL31) for the block that is partially depicted in FIG. 4C. As mentioned above with respect to FIG. 4B, local interconnects 414, 416, 418, 420 and 422 break up each conductive layers into four regions. For example, drain select gate layer SGD1 (the top layer) is divided into regions 424, 426, 428 and 430. Similarly, word line layer WLL31 is divided into regions 442, 444, 446 and 448. For word line layers (WLL0-WLL31), the regions are referred to as word line fingers; for example, word line layer WLL31 is divided into word line fingers 442, 444, 446 and 448.

Figure 4E:
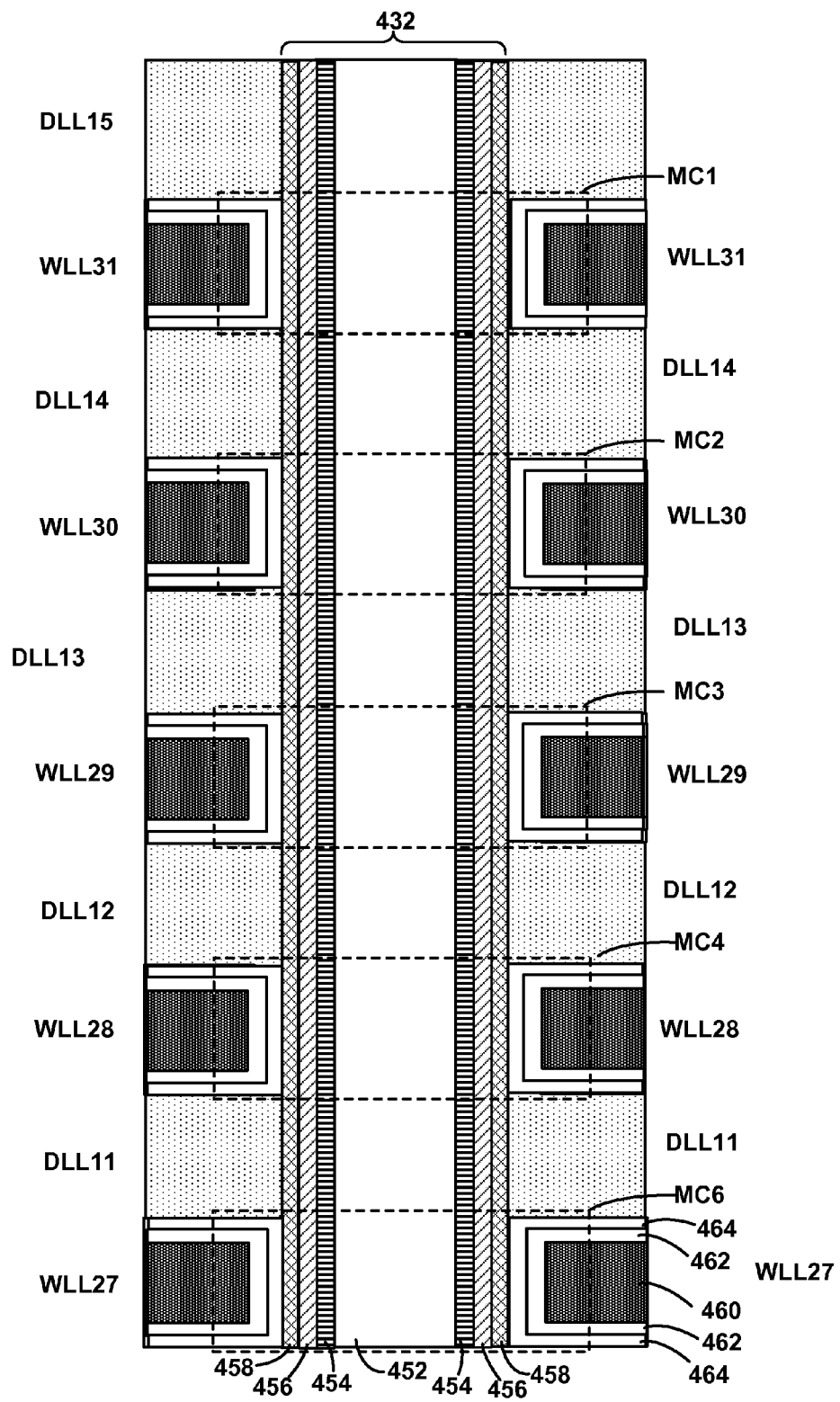
FIG. 4E is a cross-sectional view of a vertical column of memory cells.

FIG. 4E depicts a cross sectional view of region 450 of FIG. 4C that includes a portion of vertical column 432. In one embodiment, the vertical columns are round and include four layers. In other embodiments, however, more or less than four layers can be included and other shapes can be used. In one embodiment, vertical column 432 includes an inner core layer 452 that is made of a dielectric, such as $SiO_2$. Other materials can also be used. Surrounding inner core 452 is vertical polysilicon channel 454. Materials other than polysilicon can also be used. Note that vertical polysilicon channel 454 connects to the bit line. Surrounding vertical polysilicon channel 454 is a tunneling dielectric 456. In one embodiment, tunneling dielectric 456 has an oxide-nitride-oxide (ONO) structure. Surrounding tunneling dielectric 456 is charge trapping layer 458, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 460 surrounded by an aluminum oxide layer 462, which is surrounded by a blocking oxide ($SiO_2$) layer 464. The physical interaction of the word line layers with the vertical column forms the memory cells. Thus, a memory cell, in one embodiment, comprises vertical polysilicon channel 454, tunneling dielectric 456, charge trapping layer 458, blocking oxide layer 464, aluminum oxide layer 462 and word line region 460.

For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of charge trapping layer 458 which is associated with the memory cell. These electrons are drawn into charge trapping layer 458 from vertical polysilicon channel 454, through tunneling layer 458, in response to an appropriate voltage on word line region 460. The threshold voltage (Vth) of a memory cell is increased in proportion to the amount of stored charge. During an erase operation, the electrons return to the channel or holes recombine with electrons.

In an embodiment, memory cells are erased by raising the channel to an erase voltage Vera (e.g., 20-24 volts) for a sufficient period of time and grounding the word lines of a selected block while source and bit lines are floating. In blocks that are not selected to be erased, word lines are floated. Due to capacitive coupling, the unselected word lines, bit lines, select lines, and common source line are also raised to a significant fraction of erase voltage Vera, thereby impeding erase on blocks that are not selected to be erased.

Figure 5:
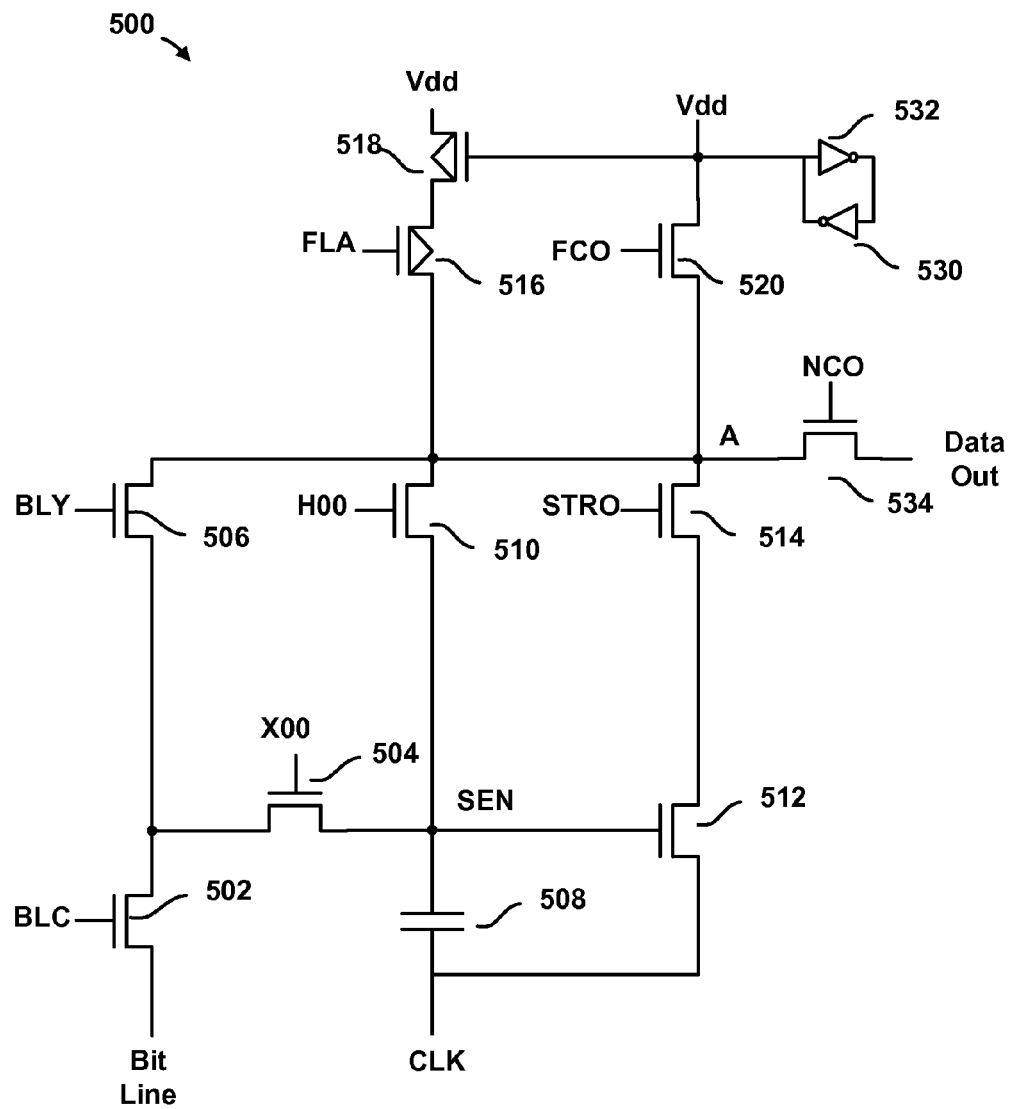
FIG. 5 is a schematic diagram of a sense amplifier.

FIG. 5 is a schematic diagram depicting a sense amplifier circuit 500. Each sense block SB1, SB2, . . . , SBp (FIG. 2) includes multiple sense amplifier circuits. As described below, sense amplifier circuit 500 pre-charges a capacitor (or other charge storage device) to a pre-charge magnitude, discharges the capacitor through the memory cell for a strobe time, and senses voltage at the capacitor after the strobe time. The sense voltage indicates whether the memory cell conducted the current being sensed for, which indicates whether the threshold voltage of the memory cell is greater than or less than a threshold voltage being tested for (corresponding to the control gate voltage).

If the threshold voltage of the memory cell is greater than the threshold voltage being tested, then, during a verify operation, the memory cell will complete programming, as appropriate based on the processes described herein. Sense amplifier circuit 500 includes a transistor 502 connected to the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504 and 506. Transistor 504 is connected to capacitor 508 at the node marked SEN. The purpose of transistor 504 is to connect capacitor 508 to the Bit Line and disconnect capacitor 508 from the Bit Line so that capacitor 508 is in selective communication with the Bit Line. In other words, transistor 504 regulates the strobe time. That is, while transistor 504 is turned ON capacitor 508 can discharge through the Bit Line, and when transistor 504 is turned OFF capacitor 508 cannot discharge through the Bit Line.

The SEN node also is connected to transistor 510 and transistor 512. Transistor 510 is connected to transistors 506, 514 and 516. Transistor 516 also is connected to transistor 518. Transistors 516 and 518 are PMOS transistors, whereas the other transistors of sense amplifier circuit 500 are NMOS transistors. Transistors 510, 516, and 518 provide a pre-charging path to capacitor 508. A voltage (e.g. Vdd or other voltage) is applied to the source of transistor 518. By appropriately biasing transistors 510, 516 and 518, the voltage applied to the source of transistor 518 can be used to pre-charge capacitor 508. After pre-charging, capacitor 508 can discharge through the Bit Line via transistor 504 (assuming that transistor 502 is conducting).

Inverters 530 and 532 form a latch circuit. The output of inverter 532 is connected to the input of inverter 530 and the output of inverter 530 is connected to the input of inverter 532 as well as transistors 518 and 520. The input of inverter 532 will receive Vdd and the two inverters 530, 532 will act as a latch to store Vdd. The input of inverter 532 also can be connected to another value. Transistors 514 and 520 provide a path for communicating the data stored by inverters 530 and 532 to transistor 512. Transistor 520 receives the signal FCO at its gate. Transistor 514 receives the signal STRO at its gate. By raising or lowering FCO and STRO, a path is provided or cut off between the inverters 530, 532 and transistor (sensing switch) 512. The gate of transistor 512 is connected capacitor 508, transistor 504 and transistor 510 at the node SEN. The other end of capacitor 508 is connected to the signal CLK.

As discussed above, capacitor 508 is pre-charged via transistors 510, 516 and 518. This will raise the voltage at the SEN node to a pre-charge voltage level (Vpre). When transistor 504 turns on, capacitor 508 can discharge through the Bit Line and the selected memory cell if the threshold voltage of the memory cell is below the voltage level being tested. If the capacitor 508 is able to discharge, then the voltage at the capacitor (at the SEN node) will decrease.

The pre-charge voltage (Vpre) at the SEN node is greater than the threshold voltage of transistor 512. Therefore, prior to the strobe time, transistor 512 is ON (conducting). Because transistor 512 is ON during the strobe time, transistor 514 should be OFF. If the capacitor does not discharge during the strobe time, then the voltage at the SEN node will remain above the threshold voltage of transistor 512 and the charge at the inverters 530, 532 can be discharged into the CLK signal when STRO turns ON transistor 514.

If the capacitor discharges sufficiently during the strobe time, then the voltage at the SEN node will decrease below the threshold voltage of transistor 512, thereby turning OFF transistor 512 and preventing the data (e.g., Vdd) stored at inverters 530, 532 from being discharged through CLK. So testing whether the inverters 530, 532 maintain their charge or discharge will indicate the result of the verification process. In one embodiment, the result can be read at node A via transistor 534 (Data Out) by turning ON transistor 534 gate signal NCO.

The pre-charge level of capacitor 508 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

Figure 6:
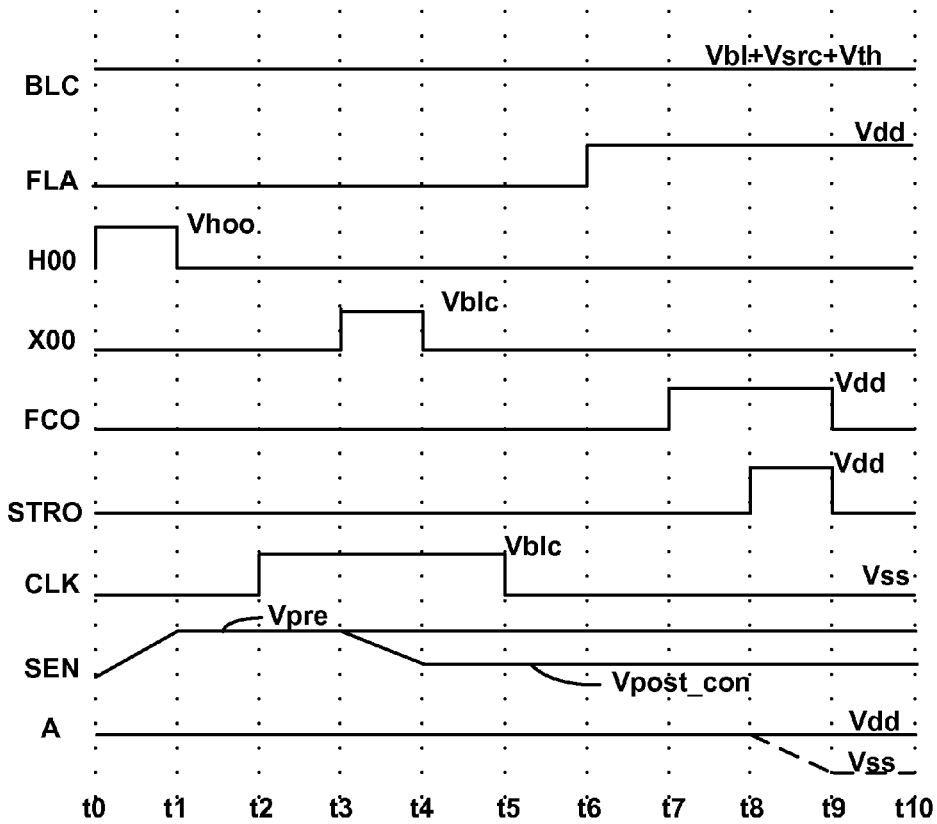
FIG. 6 is a timing diagram that describes the behavior of certain signals depicted in the sense amplifier of FIG. 5.

FIG. 6 is a timing diagram describing the behavior of various signals of FIG. 5. The signal BLC is at Vbl+Vsrc+Vth, where Vbl is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510.

At t0, the voltage of H00 is raised from ground to a pre-charge level. The raising of the voltage at H00 turns on transistor 510 and opens up the pre-charge path. The magnitude of the voltage at H00 is set. FIG. 6 shows H00 going to Vhoo. The signal H00 will stay at the pre-charge voltage (Vhoo) until time t1. While H00 is high, transistor 510 turns ON and capacitor 508 will pre-charge between t0 and t1, as depicted by the voltage at SEN. At time t1, H00 is brought down to Vss and the pre-charging is completed.

The signal X00 is used to allow capacitor 508 to be in communication with the Bit Line so that the capacitor can discharge through the Bit Line and selected memory cell. At time t3, X00 is raised to Vblc, where Vblc is the voltage of the signal BLC (discussed above). At time t4, the voltage at X00 is lowered to Vss. Between times t3 and t4, known as the strobe time, capacitor 508 will be in communication with the Bit Line to allow it to discharge through the Bit Line and the selected memory cell (depending on the threshold voltage of the selected memory cell). The signal CLK is raised to Vblc at time t2 and lowered back down to Vss at time t5 to prevent any fighting conditions in the circuit and to allow proper discharge of capacitor 508.

As discussed above, because H00 is raised between t0 and t1, capacitor 508 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 508) in response to Vh00 being applied to the gate of transistor 510.

When X00 is raised up at t3, capacitor 508 can initially pre-charge the bit line and then discharge through the Bit Line (if the threshold voltage is at the appropriate level). As depicted in FIG. 6 between t3 and t4, the voltage at the SEN node will dissipate from Vpre to Vpost_con if the memory cell turns ON (conducts) because the threshold voltage of the memory cell is less than or equal to the voltage being applied to its control gate. If the threshold voltage for the memory cell being tested is higher than the voltage applied to its control gate, capacitor 508 will not discharge and the voltage will remain at Vpre. The period between t3 and t4 is the strobe time and can be adjusted, as described above.

FIG. 6 shows that the signal FCO is raised to Vdd at t7 and lowered to Vss at t9. The signal STRO is raised to Vdd at t8 and lowered at t9. Between times t8 and t9, there is a path between inverters 530, 532 and transistor 512. If the voltage at the node SEN is greater than the threshold voltage of transistor 512, then there will be a path from inverters 530, 532 to CLK and the data at inverters 530, 532 will dissipate through the signal CLK and through the transistor 512.

If the voltage at the node SEN is lower than threshold voltage of transistor 512 (e.g., if the capacitor discharged), then transistor 512 will turn OFF and the voltage stored by inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 512 will remain ON and the voltage at node A will dissipate to Vss (as depicted by the dashed line).

If the voltage of the capacitor does dissipate (e.g., due to sufficient current flowing because the threshold voltage of the selected memory cell is below the voltage being tested for), then transistor 512 will turn OFF and the voltage at node A will remain at Vdd (as depicted by the solid line). The output of node A is provided to the Data Out signal via transistor 534 by applying Vdd to the signal NCO.

Figure 7:
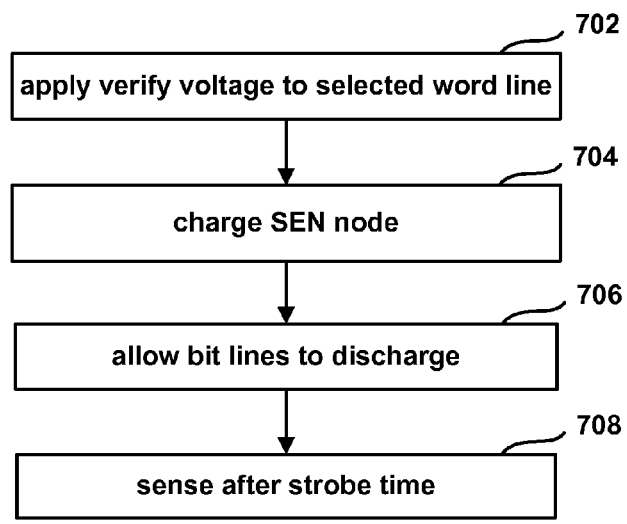
FIG. 7 is a flow chart describing one embodiment of the operation of the circuit of FIG. 5.

FIG. 7 is a flow chart describing a single strobe sensing operation performed according to the timing diagram of FIG. 6. In step 702, the appropriate verify reference voltage (e.g., Vv, Vv1, Vv2, Vv3, Vv4, Vv5, Vv6, or Vv7—see FIG. 8A) is applied to the selected word line. The selected word line is connected to the memory cells being programmed and verified. The bit lines connected to the memory cells being programmed and verified are charged to a pre-determined pre-charge level.

In step 704, all of the SEN nodes are pre-charged. In step 706, the bit lines are allowed to discharge, for example, by discharging the capacitor 508 (see t5-t6 of FIG. 6). After a predetermined time period, referred to as the "strobe time" or "integration time" the voltage of the capacitor 508 (or the SEN node) is sampled as described above to see whether the respective memory cell(s) conducted in step 708. As described above, the verification process is performed simultaneously for thousands of memory cells connected to the same word line and different bit lines.

At the end of a successful programming process (with verification), the threshold voltages of the memory cells should be within one or more distributions of threshold voltages for programmed memory cells, or within a distribution of threshold voltages for erased memory cells, as appropriate. FIG. 8A illustrates example threshold voltage distributions for a memory cell array when each memory cell stores four bits of data. Other embodiments, however, may use other data capacities per memory cell (e.g., such as one, two, three, or five bits of data per memory cell).

FIG. 8A shows sixteen threshold voltage distributions (corresponding to sixteen data states). The first threshold voltage distribution (data state) S0 represents memory cells that are erased. The other fifteen threshold voltage distributions (data states) S1-S15 represent memory cells that are programmed. Each threshold voltage distribution (data state) corresponds to predetermined values for the set of data bits.

The specific relationship between the data programmed into the memory cell and the threshold voltage levels of the memory cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. Note that state N−1 is an adjacent lower data state for state N. For example, state 7 is an adjacent lower data state for state 8.

FIG. 8A also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (i.e., S0, S1, S2, S3, . . . ) the memory cell is in.

FIG. 8A also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state Si, the system will test whether those memory cells have a threshold voltage greater than or equal to Vvi. For example, when programming memory cells to data state S1, the system will test whether those memory cells have a threshold voltage greater than or equal to Vv1. When programming memory cells to data state S2, the system will test whether the memory cells have threshold voltages greater than or equal to Vv2, and so on.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15.

For example, while some memory cells are being programmed from data state S0 to data state S1, other memory cells are being programmed from data state S0 to data state S2 and/or from data state S0 to data state S3, and so on. The arrows of FIG. 8A represent the full sequence programming.

FIG. 8B illustrates that another embodiment of threshold voltage distributions corresponding to data states S0-S15 that can partially overlap because error correction can handle a certain percentage of memory cells that are in error. Because of the size of the drawing, the references to the data states have been truncated such that 0 is used rather than S0, 1 is used rather than S1, 2 is used rather than S2, and so on.

FIG. 9A-C describe a three stage programming process for programming data into memory cells that store four bits of data. Prior to programming, all of the memory cells for a block will be erased into an erased threshold voltage distribution. For example, FIG. 9A shows a block of memory cells starting in an erased threshold voltage distribution E (depicted with a dotted line). In some embodiments, erased threshold voltage E is below zero volts. In other embodiments, erased threshold voltage distribution E is above zero volts, or partially above zero volts.

In this embodiment, the programming process includes three phases. During the first phase of programming, memory cells whose targets (due to the data to be stored in those memory cells) are data states S4, S5, S6 or S7 are programmed to an intermediate state IM0. Memory cells whose targets are data states S8, S9, S10 or S11 are programmed to an intermediate state IM1. Memory cells whose targets are data states S12, S13, S14 or S15 are programmed to an intermediate state IM2. Memory cells whose targets are data states S0, S1, S2 or S3 remain in the erased threshold voltage distribution E. The first phase is graphically depicted by FIG. 9A.

During the second phase of the programming process, memory cells that are in the erased threshold voltage distribution E are programmed to their target data states. For example, memory cells to be programmed to data state S3 are programmed from erased threshold voltage distribution E to data state S3, memory cells to be programmed to data state S2 are programmed from erased threshold voltage distribution E to data state S2, memory cells to be programmed to data state S1 are programmed from erase threshold voltage distribution E to data state S1, and memory cells to be in data state S0 are not programmed during the second phase of the programming process. Thus, erased threshold voltage distribution E becomes data state S0.

Also, during the second phase, memory cells are programmed from intermediate state IM0 to various data states S4-S7. For example, memory cells to be programmed to data state S7 are programmed from the intermediate state IM0 to data state S7, memory cells targeted to be in data state S6 are programmed from intermediate state IM0 to data state S6, memory cells to be programmed to data state S5 are programmed from intermediate state IM0 to data state S5, and memory cells to be programmed to data state S4 are programmed from intermediate state IM0 to data state S4.

Memory cells also are programmed from intermediate state IM1 to various data states S8-S11. For example, memory cells to be programmed to data state S11 are programmed from the intermediate state IM1 to data state S11, memory cells targeted to be in data state S10 are programmed from intermediate state IM1 to data state S10, memory cells to be programmed to data state S9 are programmed from intermediate state IM1 to data state S9, and memory cells to be programmed to data state S8 are programmed from intermediate state IM1 to data state S8.

Memory cells also are programmed from intermediate state IM2 to various data states S12-S15. For example, memory cells to be programmed to data state S15 are programmed from the intermediate state IM2 to data state S15, memory cells targeted to be in data state S14 are programmed from intermediate state IM2 to data state S14, memory cells to be programmed to data state S13 are programmed from intermediate state IM2 to data state S13, and memory cells to be programmed to data state S12 are programmed from intermediate state IM2 to data state S12. This second phase of programming is illustrated in FIG. 9B.

As can be seen in FIG. 9B, at the end of the second phase of programming data states S1-S15 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7, and so on. In some embodiments, all or some of the data states do not overlap.

In the third phase of programming, each of data states S1-S15 are tightened so that they no longer overlap with neighboring states. This is depicted graphically by FIG. 9C. In some embodiments, data state S0 is wider than data states S1-S15.

Figure 10:
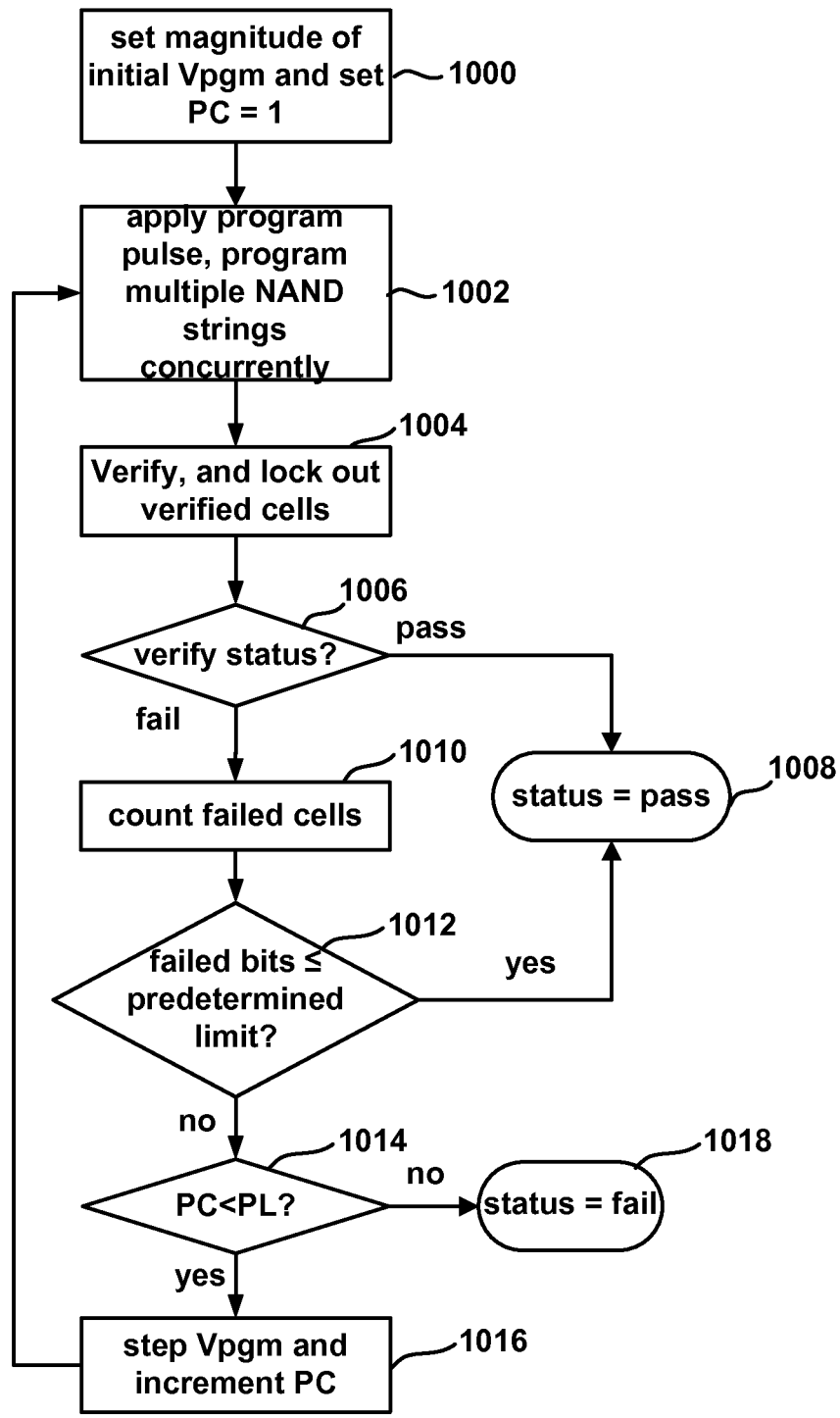
FIG. 10 is a flow chart describing one embodiment of a process for programming.

FIG. 10 is a flow chart describing one embodiment of a process for programming memory cells connected to a common word line to one or more targets (e.g., data states or threshold voltage ranges). The process of FIG. 10 can be performed one or multiple times to program data to a set of memory cells. For example, the process of FIG. 10 can be used to program memory cells from S0 to any of S1-S15 in the full sequence programming of FIG. 8A. The process of FIG. 10 can be used to program memory cells for any of the three phases of FIGS. 9A-C.

When programming a flash memory device, such as a NAND flash memory device, a program voltage Vpgm is typically applied to the word line of the memory cell and the bit line is grounded. Electrons from the channel are injected into the floating gate. When electrons accumulate in the floating gate, the floating gate becomes negatively charged and the threshold voltage of the memory cell is raised so that the memory cell is in a programmed state.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size.

In step 1000 of FIG. 10, the programming voltage Vpgm is initialized to the starting magnitude (e.g., ~12-16V or another suitable level) and a program counter PC maintained by state machine 222 (FIG. 2) is initialized at 1. In step 1002, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art.

In an embodiment, if a memory cell is to be programmed, then the corresponding bit line is grounded. On the other hand, if the memory cell is to remain at its current threshold voltage, then the corresponding bit line is connected to Vdd (e.g., 2.2V) to inhibit programming. This inhibits the cell coupled to the bit line from further programming even if it is subjected to programming pulses on its word line.

In step 1002, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 1004, the appropriate memory cells are verified using the appropriate set of target levels to perform one or more verify operations. In one embodiment, the verification process is performed by applying the testing whether the threshold voltages of the memory cells selected for programming have reached the appropriate verify reference voltage (e.g., Vv1, Vv2, Vv3, Vv4, Vv5, Vv6, and Vv7).

In step 1006, a determination is made whether all the memory cells have reached their target threshold voltages (pass). If so, the programming process is complete and successful because all selected memory cells were programmed and verified to their target states. A status of "PASS" is reported in step 1008. If, in 1006, a determination is made that not all of the memory cells have reached their target threshold voltages (fail), then the programming process continues to step 1010.

In step 1010, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1012, a determination is made whether the count from step 1010 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 1008. In this situation, enough memory cells programmed correctly such that the few remaining memory cells that have not been completely programmed can be corrected using ECC during the read process. In some embodiments, step 1010 will count the number of failed cells for each sector, each target data state or other unit, and those counts will individually or collectively be compared to a threshold in step 1012.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 1014 and the program counter PC is checked against the program limit value (PL). Examples of program limit values include 20 and 30; however, other values can be used. If the program counter PC is not less than the program limit value PL, then the program process is considered to have failed and a status of FAIL is reported in step 1018. If the program counter PC is less than the program limit value PL, then the process continues at step 1016 during which time the Program Counter PC is incremented by 1 and the program voltage Vpgm is stepped up to the next magnitude.

For example, the next pulse will have a magnitude greater than the previous pulse by a step size (e.g., a step size of 0.1-0.4 volts). After step 1016, the process loops back to step 1002 and another program pulse is applied to the selected word line.

In the embodiment described above, two different bit line biases are used: a first bit line bias (e.g., Vdd) if the corresponding memory is to be inhibited from programming, and a second bit line bias (e.g., 0V) if a corresponding memory cell is to be programmed. Thus, in such a bit line biasing scheme, for all memory cells being programmed, a single bit line bias is the used (e.g., 0V) regardless of the target state of the memory cell.

In another embodiment, more than two bit line biases are used: a first bit line bias (e.g., Vdd) if the corresponding memory cell is to be inhibited from programming, and multiple programming bit line biases for corresponding memory cells being programmed. In particular, if a memory cell is to be programmed, the corresponding bit line is biased based on the target data state of the memory cell being programmed.

Figure 11:
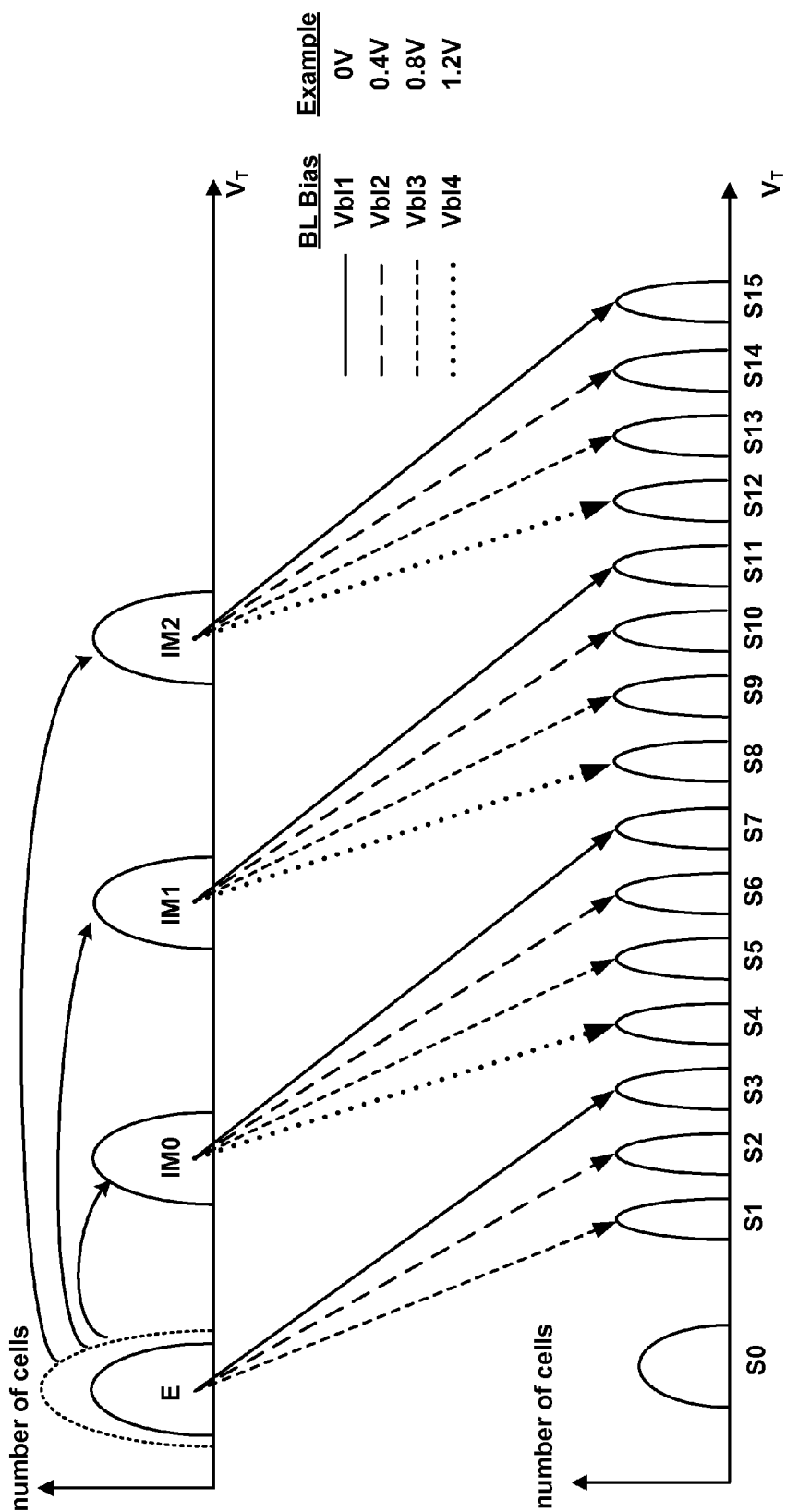
FIG. 11 depicts an example programming process.

FIG. 11 describes an example programming process that uses multiple programming bit line biases for concurrent programming of corresponding memory cells. In the illustrated example, a programming process is described for programming data into memory cells that store four bits of data. Prior to programming, all of the memory cells for a block are erased into an erased threshold voltage distribution. For example, a block of memory cells start in an erased threshold voltage distribution E (depicted with a dotted line). In some embodiments, erased threshold voltage E is below zero volts. In other embodiments, erased threshold voltage distribution E is above zero volts, or partially above zero volts.

The programming process includes two phases. During the first programming phase, those memory cells whose targets (due to the data to be stored in those memory cells) are data states S4, S5, S6 or S7 are programmed to an intermediate state IM0. Those memory cells whose targets are data states S8, S9, S10 or S11 are programmed to an intermediate state IM1. Those memory cells whose targets are data states S12, S13, S14 or S15 are programmed to an intermediate state IM2. Those memory cells whose targets are data states S0, S1, S2 or S3 remain in the erased threshold voltage distribution E.

During the second programming phase, memory cells are concurrently programmed from the intermediate state or the erased state to the target data states, and the corresponding bit line is biased based on the target data state of the memory cell being programmed, as set forth in Table 1:

TABLE 1

| Target State | Programming Bit Line Bias |
| --- | --- |
| S3, S7, S11, S15 | Vbl1 |
| S2, S6, S10, S14 | Vbl2 |
| S1, S5, S9, S13 | Vbl3 |
| S4, S8, S12 | Vbl4 |

Thus, in this example, four programming bit line biases (Vbl1, Vbl2, Vbl3 and Vbl4) are used for corresponding memory cells being programmed that store four bits of data.

Referring again to FIG. 11, memory cells are concurrently programmed from intermediate state IM2 to various data states S12-S15 with the corresponding bit line biased based on the target data state. For example, memory cells to be programmed to data state S15 are programmed from intermediate state IM2 to data state S15 using a first programming bit line bias Vbl1 (e.g., 0V), memory cells targeted to be in data state S14 are programmed from intermediate state IM2 to data state S14 using a second programming bit line bias Vbl2 (e.g., 0.4V), memory cells to be programmed to data state S13 are programmed from intermediate state IM2 to data state S13 using a third programming bit line bias Vbl3 (e.g., 0.8V), and memory cells to be programmed to data state S12 are programmed from intermediate state IM2 to data state S12 using a fourth programming bit line bias Vbl4 (e.g., 1.2V). First programming bit line bias Vbl1, second programming bit line bias Vbl2, third programming bit line bias Vbl3 and fourth programming bit line bias Vbl4 may have values other than the example values listed above and shown in FIG. 11.

Memory cells also are concurrently programmed from intermediate state IM1 to various data states S8-S11 with the corresponding bit line biased based on the target data state. For example, memory cells to be programmed to data state S11 are programmed from intermediate state IM1 to data state S11 using the first programming bit line bias Vbl1, memory cells targeted to be in data state S10 are programmed from intermediate state IM1 to data state S10 using the second programming bit line bias Vbl2, memory cells to be programmed to data state S9 are programmed from intermediate state IM1 to data state S9 using the third programming bit line bias Vbl3, and memory cells to be programmed to data state S8 are programmed from intermediate state IM1 to data state S8 using the fourth programming bit line bias Vbl4.

Memory cells also are concurrently programmed from intermediate state IM0 to various data states S4-S7 with the corresponding bit line biased based on the target data state. For example, memory cells to be programmed to data state S7 are programmed from intermediate state IM0 to data state S7 using the first programming bit line bias Vbl1, memory cells targeted to be in data state S6 are programmed from intermediate state IM0 to data state S6 using the second programming bit line bias Vbl2, memory cells to be programmed to data state S5 are programmed from intermediate state IM0 to data state S5 using the third programming bit line bias, and memory cells to be programmed to data state S4 are programmed from intermediate state IM0 to data state S4 using the fourth programming bit line bias Vbl4.

Memory cells also are concurrently programmed from the erased threshold voltage distribution E to various data states S1-S3 with the corresponding bit line biased based on the target data state. For example, memory cells to be programmed to data state S3 are programmed from erased threshold voltage distribution E to data state S3 using the first programming bit line bias Vbl1, memory cells to be programmed to data state S2 are programmed from erased threshold voltage distribution E to data state S2 using the second programming bit line bias Vbl2, memory cells to be programmed to data state S1 are programmed from erase threshold voltage distribution E to data state S1 using the third programming bit line bias Vbl3, and memory cells to be in data state S0 are not programmed during the second phase of the programming process. Thus, erased threshold voltage distribution E becomes data state S0.

As can be seen from FIG. 11, the bit line bias used during programming corresponds to a voltage difference between the intermediate state distribution and the target state distribution. That is, data states S15, S11, S7 and S3 have the greatest voltage difference from intermediate state distributions IM2, IM1, IM0 and E, and are programmed using the first programming bit line bias Vbl1. Likewise, data states S14, S10, S6 and S2 have a first lower voltage difference from intermediate state distributions IM2, IM1, IM0 and E, and are programmed using the second programming bit line bias Vbl2. Similarly, data states S13, S9, S5 and S1 have a second lower voltage difference from intermediate state distributions IM2, IM1, IM0 and E, and are programmed using the third programming bit line bias Vbl3. Finally, data states S12, S8, and S4 have a third lower voltage difference from intermediate state distributions IM2, IM1, IM0 and E, and are programmed using the fourth programming bit line bias Vbl4.

To reduce coupling between bit lines, even memory cells should be programmed separately from odd memory cells.

Although FIG. 11 describes a two-phase programming process for programming data into memory cells that store four bits of data, similar multi-bit line bias techniques may be used for programming data into memory cells that store more or fewer than four bits of data. In addition, although FIG. 11 describes a programming process that uses four programming bit line biases, more or fewer than four programming bit line biases may be used. In addition, although FIG. 11 describes a two-phase programming process, similar multi-bit line bias techniques may be used for programming processes that use more than two phases.

In the embodiment described in FIG. 11, five different bit line biases are used: an inhibit bit line bias (e.g., Vdd) if the corresponding memory is to be inhibited from programming, and four programming bit line biases for corresponding memory cells being programmed, with the programming bit line biases based on the target data state of the memory cell being programmed.

Figure 12:
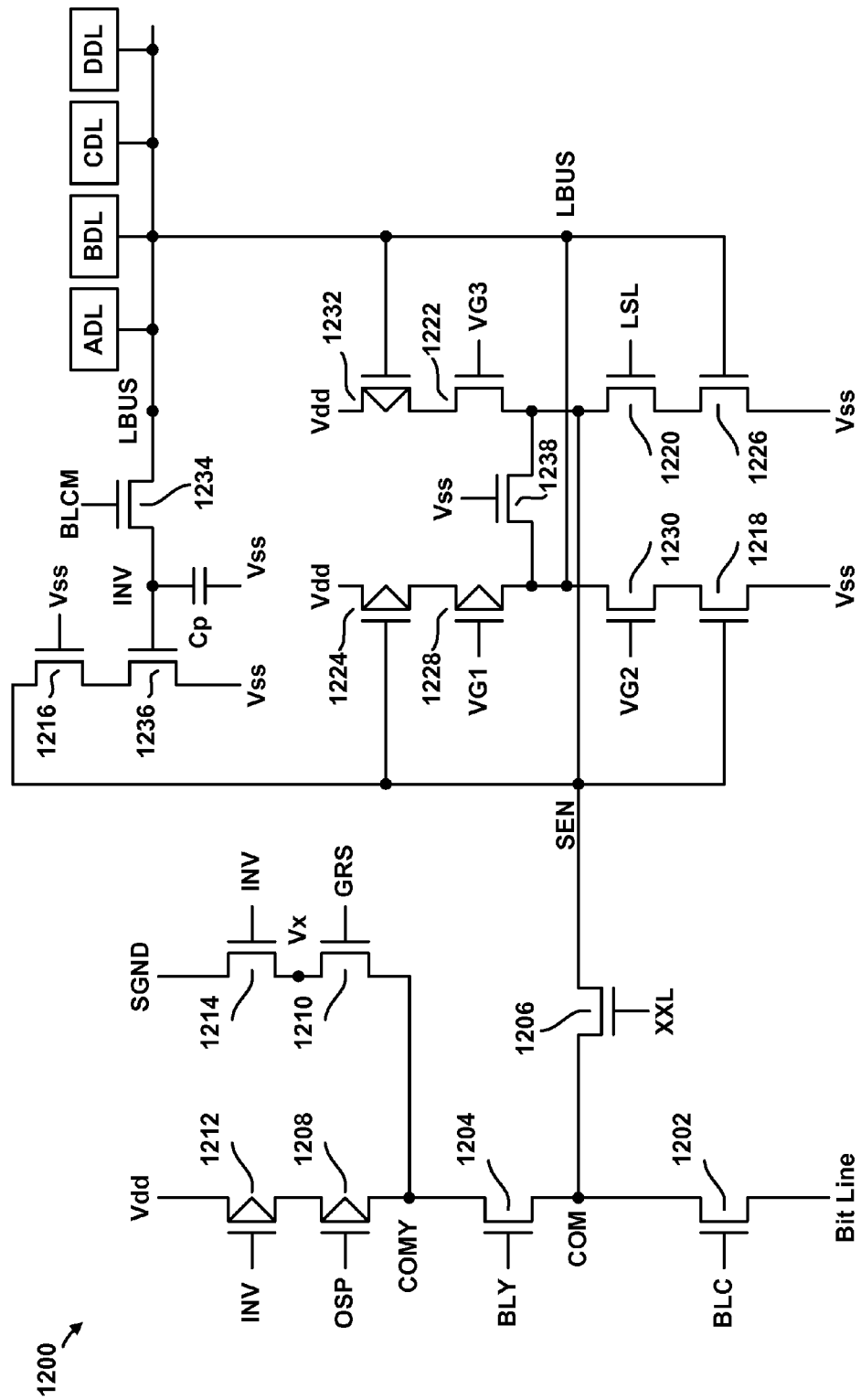
FIG. 12 is a schematic diagram of a sense amplifier.

FIG. 12 is a schematic diagram depicting a sense amplifier circuit 1200 that provides an inhibit bit line bias and multiple programming bit line biases based on the target data state of the memory cell being programmed.

Sense amplifier circuit 1200 includes a transistor 1202 connected to the Bit Line and a COM node. Transistor 1202 receives a signal BLC at its gate, and connects or disconnects the Bit Line to the COM node based on the voltage level of signal BLC. If signal BLC is HIGH (e.g., Vdd), transistor 1202 is ON and the Bit Line charges to the voltage potential of the COM node. If signal BLC is LOW (e.g., 0V), transistor 1202 is OFF and the Bit Line floats.

Transistor 1202 is an n-channel transistor connected at the COM node to n-channel transistors 1204 and 1206. Transistor 1204 receives a signal BLY at its gate, and connects or disconnects the COM node to the COMY node based on the voltage level of signal BLY. If signal BLY is HIGH, transistor 1204 is ON and the COM node is connected to the COMY node. If signal BLY is LOW, transistor 1204 is OFF and the COM node is disconnected from the COMY node.

Transistor 1206 receives a signal XXL at its gate, and connects or disconnects the COM node to the SEN node based on the voltage level of signal XXL. If signal XXL is HIGH, transistor 1206 is ON and the COM node is connected to the SEN node. If signal XXL is LOW, transistor 1206 is OFF and the COM node is disconnected from the SEN node.

Transistor 1204 is connected at the COMY node to p-channel transistor 1208 and n-channel transistor 1210. Transistor 1208 receives a signal OSP at its gate, and is coupled to signal Vdd through p-channel transistor 1212, which receives a signal INV at its gate. Transistor 1210 receives a signal GRS at its gate, and is coupled at node Vx to the source terminal of n-channel transistor 1214, which receives a signal INV at its gate, and has its drain terminal coupled to signal SGND.

If signal INV, OSP and XXL are LOW, and signals BLY and BLC are HIGH, transistors 1202, 1204, 1208 and 1212 are ON, transistors 1206 and 1214 are OFF, and the Bit Line is charged to Vdd (e.g., 2.2V), the inhibit bit line bias. Other values of Vdd may be used.

If signal INV, GRS, BLY and BLC are HIGH, signal XXL is LOW, and signal SGND=Vss (e.g., 0V), transistors 1202, 1204, 1210 and 1214 are ON, transistors 1206 and 1212 are OFF, and the Bit Line is charged to Vss, the first programming bit line bias Vbl1.

Transistor 1206 is connected at the SEN node to n-channel transistors 1216, 1218, 1220 and 1222, and to p-channel transistor 1224. Transistor 1216 has a drain terminal coupled to the SEN node, and a gate terminal coupled to Vss, and is OFF. Transistor 1218 has a gate terminal coupled to the SEN node, and a source terminal coupled to Vss. Transistor 1220 has a drain terminal coupled to a source terminal of transistor 1222, a gate terminal coupled to a signal LSL, and has a source terminal coupled to a drain terminal of an n-channel transistor 1226. Transistor 1226 has a gate terminal coupled to a signal LBUS, and has a source terminal coupled to Vss.

Transistor 1224 has a source terminal coupled to Vdd, a gate terminal coupled to the SEN node, and a drain terminal coupled to a source terminal of a p-channel transistor 1228. Transistor 1228 has agate terminal coupled to a signal VG1, and a drain terminal coupled to a drain terminal of an n-channel transistor 1230. Transistor 1230 has a gate terminal coupled to a signal VG2, and a source terminal coupled to a drain terminal of transistor 1218.

Transistor 1222 has a gate terminal coupled to a signal VG3, and a drain terminal coupled to a drain terminal of a p-channel transistor 1232. Transistor 1232 has a gate terminal coupled to signal LBUS, and a source terminal coupled to Vdd.

If signals BLC, XXL, LSL, LBUS and VG1 are HIGH, and signals BLY, VG2 and VG3 is LOW, transistors 1202, 1206, 1220 and 1226 are ON, transistors 1204, 122 and 1228 are OFF, the SEN node is connected to Vss, and the Bit Line is charged to Vss, the first programming bit line bias Vbl1.

N-channel transistor 1234 has a drain terminal coupled to signal LBUS, a gate terminal coupled to signal BLCM, and a source terminal coupled at node INV to a gate terminal of n-channel transistor 1236. A parasitic capacitor Cp is coupled between node INV and Vss, and has a value of about 10 fF. Transistor 1236 has a drain terminal coupled to a drain terminal of transistor 1216, and a source terminal coupled to Vss.

An n-channel transistor 1238 has a drain terminal coupled to the drain terminal of transistor 1228, a gate terminal coupled to Vss, and a source terminal coupled to a source terminal of transistor 1222. Transistor 1238 is OFF.

If LBUS is HIGH, and signal BLCM is at least a threshold voltage higher than node INV, node INV is:

$$INV = BLCM - Vt \quad (1)$$

where Vt is the threshold voltage of transistor 1234.

In an embodiment, signal BLCM may have the following values: $V2 = Vbl2 + 2 \times Vt$, $V3 = Vbl3 + 2 \times Vt$, and $V4 = Vbl4 + 2 \times Vt$, where Vbl2, Vbl3, and Vbl4 are the second programming bit line bias, third programming bit line bias and fourth programming bit line bias (described above), and Vt is the threshold voltage of transistor 1234. For each of the BLCM values V2, V3 and V4, INV has corresponding values $V2A = Vbl2 + Vt$, $V3A = Vbl3 + Vt$, and $V4A = Vbl4 + Vt$. In an embodiment, Vbl2=0.4V, Vbl3=0.8V and Vbl4=1.2V, although other values may be used.

If signal BLC, BLY, OSP and GRS are HIGH, signal XXL is LOW, and signal SGND=Vdd, transistors 1202, 1204 and 1210 are ON, transistors 1206 and 1208 are OFF. If signal INV is set in accordance with equation (1), and if transistor 1214 has a threshold voltage Vt, the voltage at node Vx is given by:

$$Vx = INV - Vt = BLCM - 2 \times Vt \quad (2)$$

Accordingly, the voltage at node Vx may have the following values: Vbl2, Vbl3, and Vbl4, and can be selected based on the value of signal BLCM. Because transistors 1202, 1204 and 1210 are ON, the Bit Line is charged to second programming bit line bias Vbl2, third programming bit line bias Vbl3, and fourth programming bit line bias Vbl4 based on the value of BLCM.

Sense amp 1200 also includes data latches ADL, BDL, CDL and DDL coupled to LBUS. Data latches ADL, BDL, CDL and DDL store the data to be programmed into the memory cell. For a memory cell that stores four bits of data, four data latches are used, for a memory cell that stores three bits of data, three data latches are used, and so on. The value of signal LBUS is configured based on the data stored in data latches ADL, BDL, CDL and DDL.

Figure 13A:
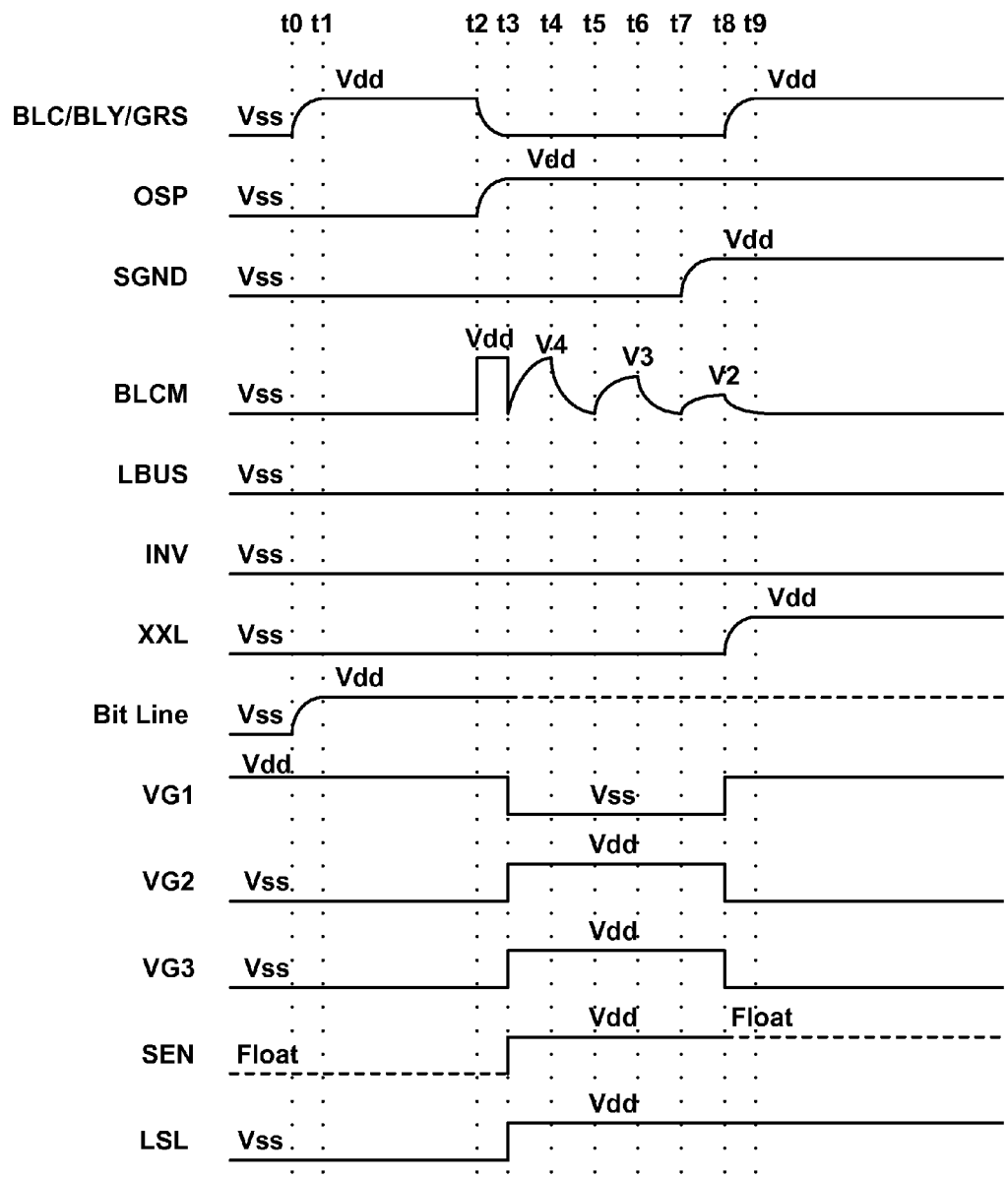
FIGS. 13A-13E are timing diagrams that describe the behavior of certain signals depicted in the sense amplifier of FIG. 12.

FIGS. 13A-13E are timing diagrams describing various signals of FIG. 12. FIG. 13A describes signals for biasing a bit line at an inhibit bit line bias (e.g., Vdd), FIG. 13B describes signals for biasing a bit line at fourth programming bit line bias Vbl4 (e.g., 1.2V), FIG. 13C describes signals for biasing a bit line at third programming bit line bias Vbl3 (e.g., 0.8V), FIG. 13D describes signals for biasing a bit line at second programming bit line bias Vbl2 (e.g., 0.4V), and FIG. 13E describes signals for biasing a bit line at first programming bit line bias Vbl1 (e.g., 0V).

Referring to FIGS. 12 and 13A, prior to time t0, the SEN node is floating, VG1 is at Vdd (HIGH), and all other signals are at Vss (LOW). From t0 to t1, BLC and BLY go HIGH, INV, OSP and XXL are LOW, transistors 1202, 1204, 1208 and 1212 turn ON, and transistors 1206 and 1214 are OFF. Thus, the Bit Line charges through transistors 1202, 1204, 1208 and 1212 to the inhibit bit line voltage Vdd. From t2 to t3, BLC and BLY go LOW, turning OFF transistors 1202 and 1204, floating the Bit Line. At the same time, OSP goes HIGH, turning OFF transistor 1208. LBUS is controlled based on the data value in data latches ADL, BDL, CDL and DDL. INV and LBUS remain LOW, keeping transistors 1214 and 1226 OFF. Thus, the Bit Line remains floating for the remainder of the period.

Figure 13B:
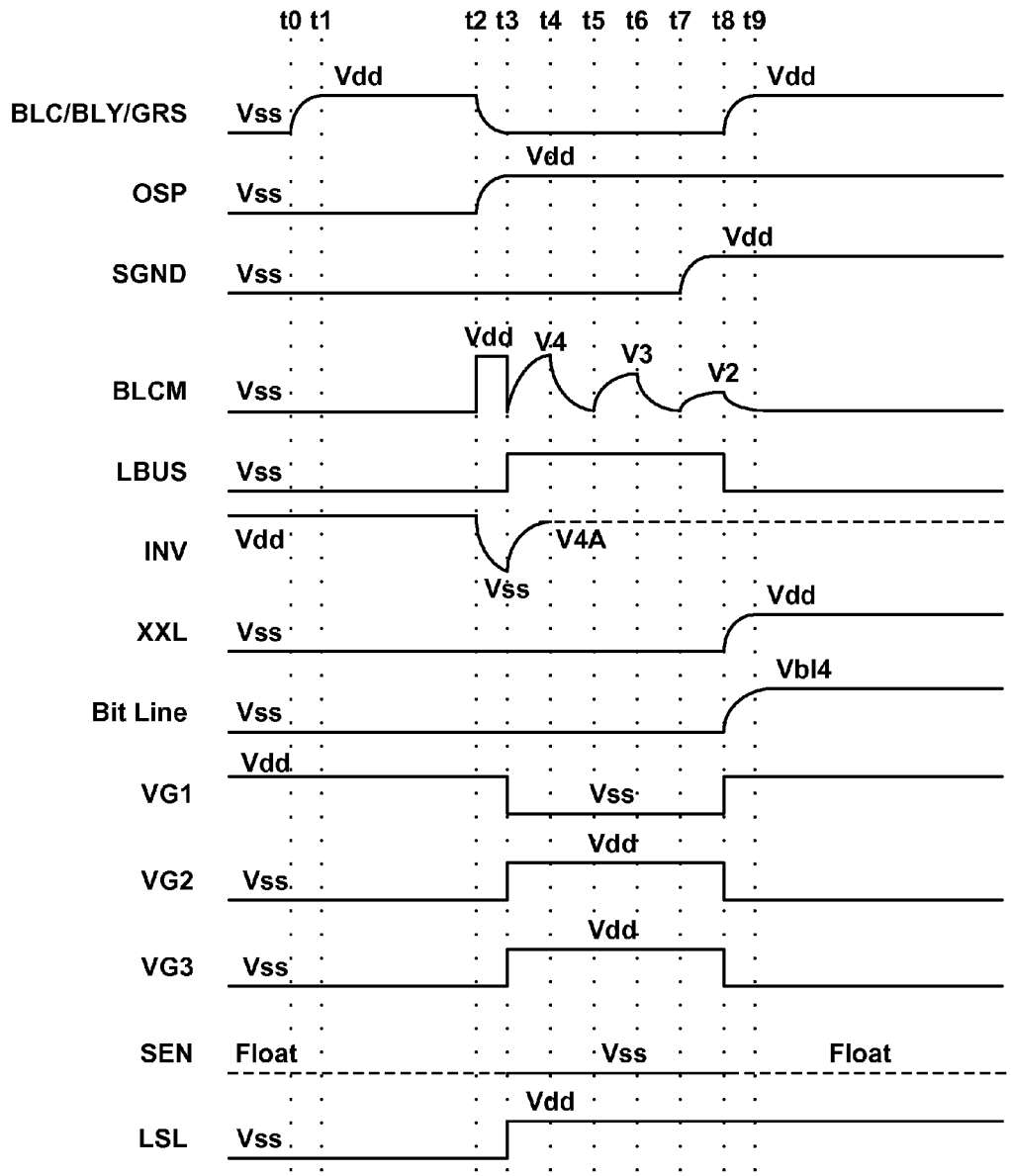

Referring to FIGS. 12 and 13B, prior to time t0, the SEN node is floating, INV and VG1 are at Vdd (HIGH), and all other signals are at Vss (LOW). From t0 to t1, BLC, BLY and GRS go HIGH, XXL is LOW, transistors 1202, 1204, 1210 and 1214 turn ON, transistors 1206 and 1212 are OFF and SGND=Vss. Thus, the Bit Line is pulled to Vss through transistors 1202, 1204, 1210 and 1214. From t2 to t3, BLC, BLY, and GRS go LOW and OSP and BLCM go HIGH, turning OFF transistors 1202, 1204, 1208, 1210 and 1214, and turning ON transistor 1234, pulling INV LOW. At t3, LBUS, which is controlled based on the data value in data latches ADL, BDL, CDL and DDL, and LSL both go HIGH, turning ON transistors 1220 and 1226 and pulling the SEN node to Vss. From t3 to t4, BLCM ramps up to V4. INV ramps up to V4A and then is floated as a result of transistor 1234 turning OFF as BLCM drops below INV. From t7 to t8, SGND ramps up to Vdd. At t8, LBUS goes LOW, turning OFF transistor 1226, and floating the SEN node. From t8 to t9, BLC, BLY and GRS go HIGH, turning ON transistors 1202, 1204 and 1210. Thus, the Bit Line charges through transistors 1202, 1204 and 1210 to the fourth programming bit line bias Vbl4 present at node Vx. The bit line remains driven at the fourth programming bit line bias Vbl4 for the remainder of the period.

Figure 13C:
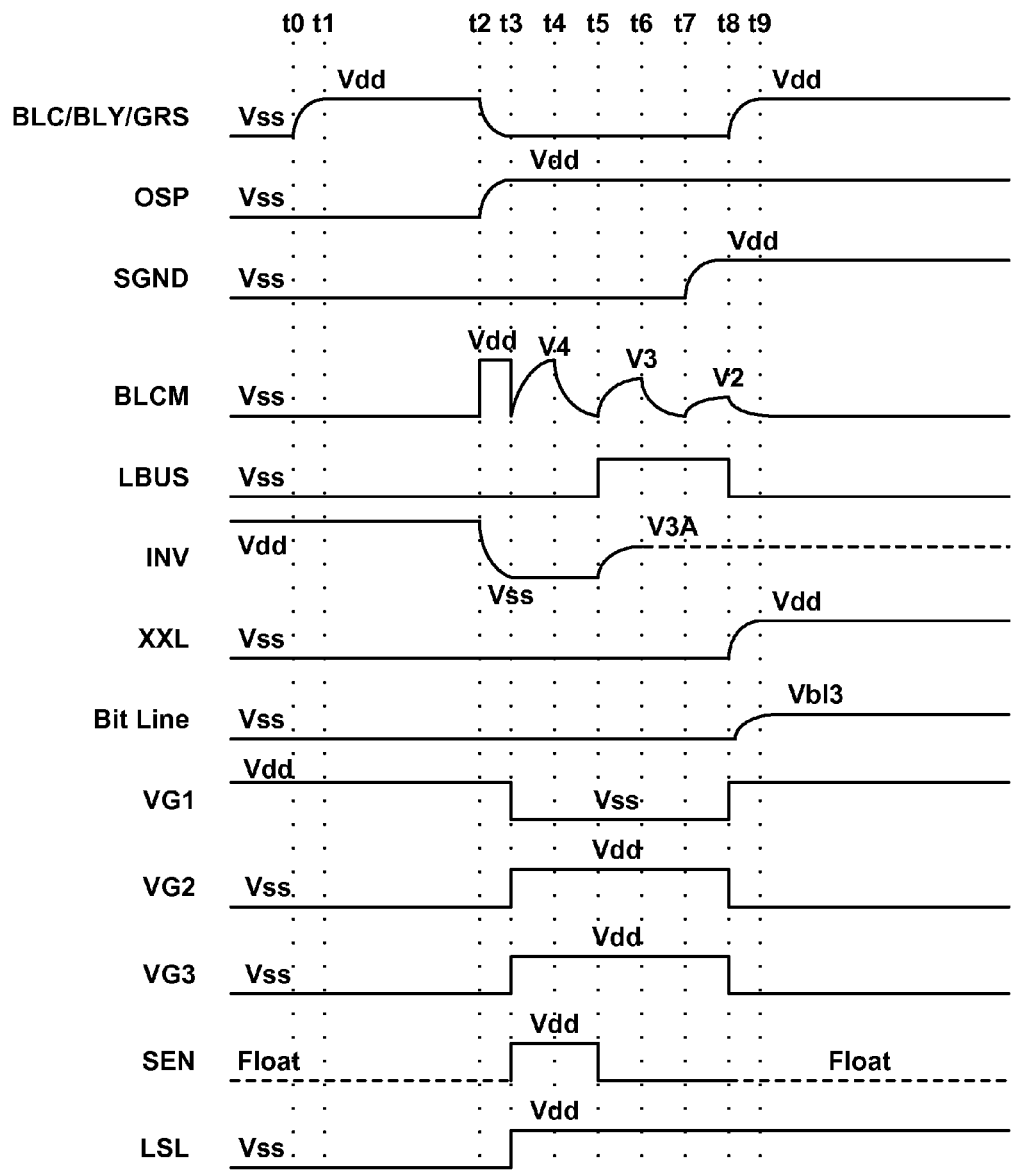

Referring to FIGS. 12 and 13C, prior to time t0, the SEN node is floating, INV and VG1 are at Vdd (HIGH), and all other signals are at Vss (LOW). From t0 to t1, BLC, BLY and GRS go HIGH, XXL is LOW, transistors 1202, 1204, 1210 and 1214 turn ON, transistors 1206 and 1212 are OFF and SGND=Vss. Thus, the Bit Line is pulled to Vss through transistors 1202, 1204, 1210 and 1214. From t2 to t3, BLC, BLY, and GRS go LOW and OSP and BLCM go HIGH, turning OFF transistors 1202, 1204, 1208, 1210 and 1214, and turning ON transistor 1234, pulling INV LOW. At t3, LSL and VG3 go HIGH. LBUS is LOW, so transistors 1222 and 1232 turn ON, and the SEN node is pulled to Vdd. At t5, LBUS, which is controlled based on the data value in data latches ADL, BDL, CDL and DDL goes HIGH, turning OFF transistor 1232 and turning ON transistor 1226. Transistor 1220 also turns ON, pulling the SEN node to Vss. From t5 to t6, BLCM ramps up to V3. INV ramps up to V3A and then is floated as a result of transistor 1234 turning OFF as BLCM drops below INV. From t7 to t8, SGND ramps up to Vdd. At t8, LBUS goes LOW, turning OFF transistor 1226, and floating the SEN node. From t8 to t9, BLC, BLY and GRS go HIGH, turning ON transistors 1202, 1204 and 1210. Thus, the Bit Line charges through transistors 1202, 1204 and 1210 to the third programming bit line bias Vbl3 present at node Vx. The bit line remains driven at the third programming bit line bias Vbl3 for the remainder of the period.

Figure 13D:
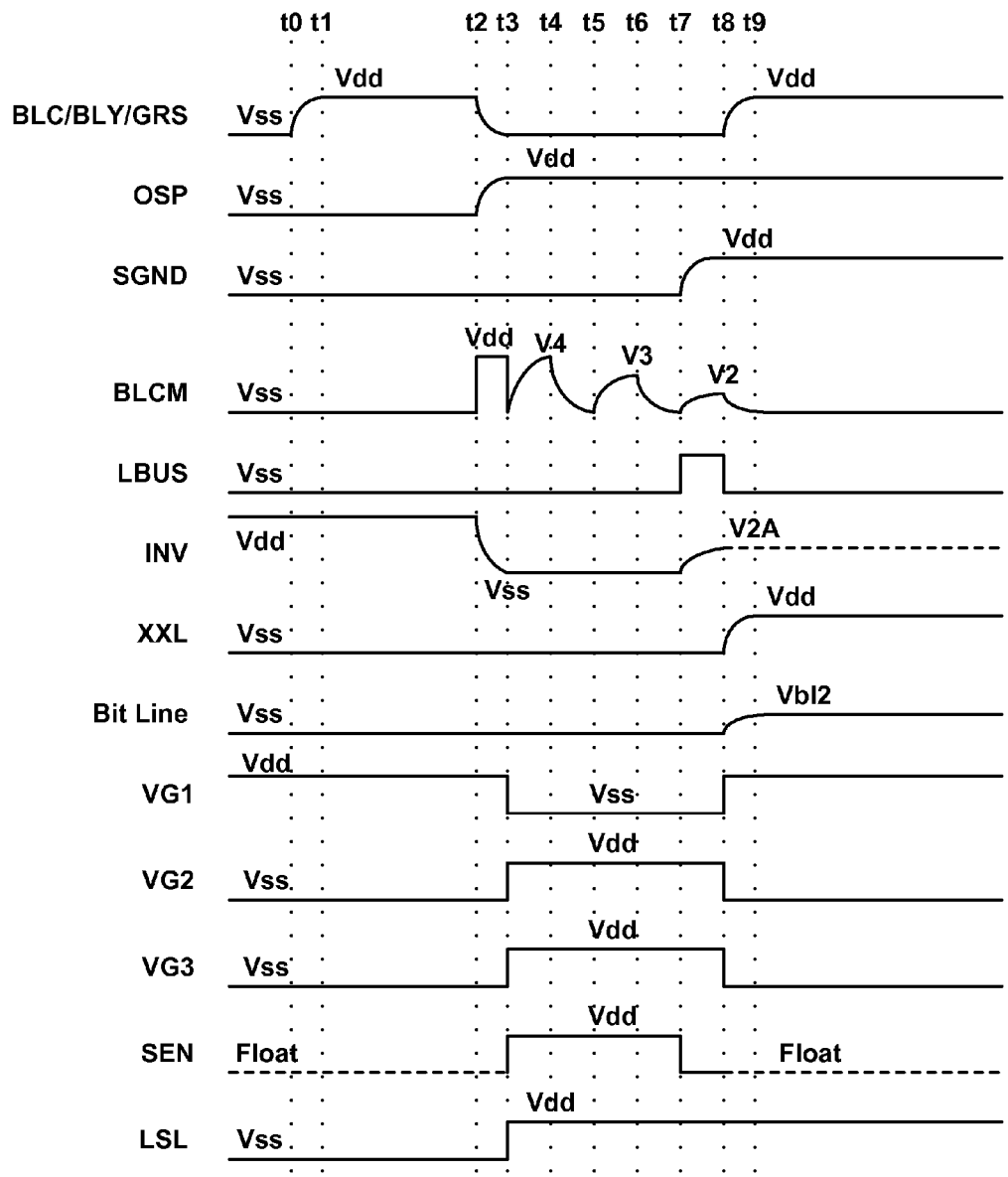

Referring to FIGS. 12 and 13D, prior to time t0, the SEN node is floating, INV and VG1 are at Vdd (HIGH), and all other signals are at Vss (LOW). From t0 to t1, BLC, BLY and GRS go HIGH, XXL is LOW, transistors 1202, 1204, 1210 and 1214 turn ON, transistors 1206 and 1212 are OFF and SGND=Vss. Thus, the Bit Line is pulled to Vss through transistors 1202, 1204, 1210 and 1214. From t2 to t3, BLC, BLY, and GRS go LOW and OSP and BLCM go HIGH, turning OFF transistors 1202, 1204, 1208, 1210 and 1214, and turning ON transistor 1234, pulling INV LOW. At t3, LSL and VG3 go HIGH. LBUS is LOW, so transistors 1222 and 1232 turn ON, and the SEN node is pulled to Vdd. At t7, LBUS, which is controlled based on the data value in data latches ADL, BDL, CDL and DDL goes HIGH, turning OFF transistor 1232 and turning ON transistor 1226. Transistor 1220 also turns ON, pulling the SEN node to Vss. From t7 to t8, BLCM ramps up to V2. INV ramps up to V2A and then is floated as a result of transistor 1234 turning OFF as BLCM drops below INV. From t7 to t8, SGND ramps up to Vdd. At t8, LBUS goes LOW, turning OFF transistor 1226, and floating the SEN node. From t8 to t9, BLC, BLY and GRS go HIGH, turning ON transistors 1202, 1204 and 1210. Thus, the Bit Line charges through transistors 1202, 1204 and 1210 to the second programming bit line bias Vbl2 present at node Vx. The bit line remains driven at the second programming bit line bias Vbl2 for the remainder of the period.

Figure 13E:
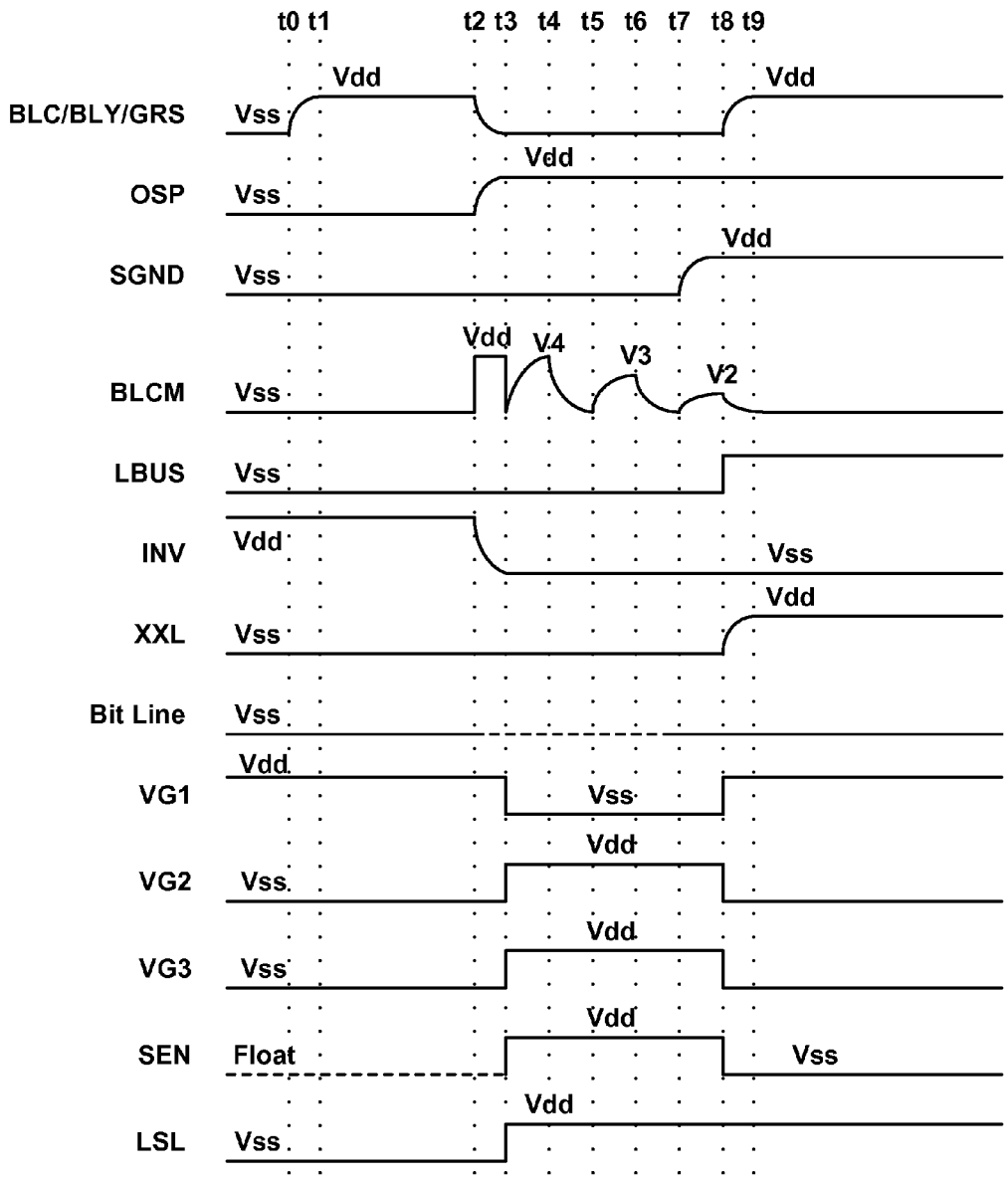

Referring to FIGS. 12 and 13E, prior to time t0, the SEN node is floating, INV and VG1 are at Vdd (HIGH), and all other signals are at Vss (LOW). From t0 to t1, BLC, BLY and GRS go HIGH, XXL is LOW, transistors 1202, 1204, 1210 and 1214 turn ON, transistors 1206 and 1212 are OFF and SGND=Vss. Thus, the Bit Line is pulled to Vss through transistors 1202, 1204, 1210 and 1214. From t2 to t3, BLC, BLY, and GRS go LOW and OSP and BLCM go HIGH, turning OFF transistors 1202, 1204, 1208, 1210 and 1214, and turning ON transistor 1234, pulling INV LOW. At t3, LSL and VG3 go HIGH. LBUS is LOW, so transistors 1222 and 1232 turn ON, and the SEN node is pulled to Vdd. At t8, LBUS, which is controlled based on the data value in data latches ADL, BDL, CDL and DDL goes HIGH, turning OFF transistor 1232 and turning ON transistor 1226. Transistor 1220 also turns ON, pulling the SEN node to Vss. From t8 to t9, BLC and XXL go HIGH, turning ON transistors 1220 and 1226. Thus, the Bit Line is pulled to Vss, the first programming bit line bias Vbl1, through transistors 1202, 1206, 1220 and 1226. The bit line remains pulled to the first programming bit line bias Vbl1 for the remainder of the period.

One embodiment includes a method for programming a non-volatile memory. The method includes programming memory cells for even bit lines by programming the memory cells into a plurality of intermediate data states from an erased state, and for each of the intermediate data states, concurrently programming the memory cells to a plurality of target data states. The method also includes programming memory cells for odd bit lines by programming the memory cells into the plurality of intermediate data states from an erased state, and for each of the intermediate data states, concurrently programming the memory cells to the plurality of target data states.

One embodiment includes a non-volatile memory including a controller configured to program memory cells. The controller programs memory cells for even bit lines by programming the memory cells into a plurality of intermediate data states from an erased state, and for each of the intermediate data states, concurrently programming the memory cells to a plurality of target data states. The controller programs memory cells for odd bit lines by programming the memory cells into the plurality of intermediate data states from an erased state, and for each of the intermediate data states, concurrently programming the memory cells to the plurality of target data states.

One embodiment includes a sense amplifier for a non-volatile memory that includes a plurality of memory cells, each memory cell comprising a corresponding bit line. The sense amplifier includes circuitry configured to bias each bit line based on a target data state of the corresponding memory cell being programmed.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. A method comprising:
    programming a memory cell coupled to a bit line by:
        programming the memory cell to an intermediate data state from an erased state; and
        programming the memory cell from the intermediate data state to a target data state by biasing the bit line to one of a plurality of bit line bias voltages, the bit line bias voltage determined based on the target data state,
    wherein the bit line bias voltage is based on a voltage difference between an intermediate state distribution and the target state distribution.

2. The method of claim 1, further comprising:
    programming the memory cell to one of a plurality of intermediate data states from the erased state; and
    programming the memory cell from the one of a plurality of intermediate data states to the target data state by biasing the bit line to the one of a plurality of bit line bias voltages.

3. The method of claim 1, further comprising programming a second memory cell coupled to a second bit line by programming the second memory cell from the erased state to a second target data state by biasing the second bit line to one of a plurality of second bit line bias voltages, the second bit line bias voltage determined based on the second target data state.

4. The method of claim 1, wherein a number of the plurality of bit line bias voltages equals a number of data states that may be stored in the memory cell.

5. The method of claim 1, wherein the plurality of bit line bias voltages comprises four bit line bias voltages.

6. The method of claim 1, wherein the plurality of bit line bias voltages comprises a first bit line bias voltage of about 0V, a second bit line bias voltage of about 0.4V, a third bit line bias voltage of about 0.8V, and a fourth bit line bias voltage of about 1.2V.

7. The method of claim 1, wherein the non-volatile memory comprises a two-dimensional or a three-dimensional non-volatile memory.

8. A non-volatile memory comprising:
a bit line;
a memory cell coupled to the bit line; and
a controller configured to program the memory cell to a target data state by biasing the bit line to one of a plurality of bit line bias voltages, the bit line bias voltage determined based on the target data state,
wherein the bit line bias voltage is based on a voltage difference between an intermediate state distribution and a target state distribution.

9. The non-volatile memory of claim 8, wherein:
the non-volatile memory further comprises a sense amplifier coupled to the bit line and the controller; and
the controller is further configured to cause the sense amplifier to bias the bit line to the one of a plurality of bit line bias voltages.

10. The non-volatile memory of claim 9, wherein the controller is further configured to:
program the memory cell from an erased state to an intermediate data state; and
program the memory cell from the intermediate data state to the target data state by biasing the bit line to the one of a plurality of bit line bias voltages.

11. The non-volatile memory of claim 8, wherein the controller is further configured to program the memory cell from an erased state to the target data state by biasing the bit line to the one of a plurality of bit line bias voltages.

12. The non-volatile memory of claim 8, wherein a number of the plurality of bit line bias voltages equals a number of data states that may be stored in the memory cell.

13. The non-volatile memory of claim 8, wherein the plurality of bit line bias voltages comprises four bit line bias voltages.

14. The non-volatile memory of claim 8, wherein the plurality of bit line bias voltages comprises a first bit line bias voltage of about 0V, a second bit line bias voltage of about 0.4V, a third bit line bias voltage of about 0.8V, and a fourth bit line bias voltage of about 1.2V.

15. The non-volatile memory of claim 8, wherein the non-volatile memory comprises a two-dimensional or a three-dimensional non-volatile memory.

16. A sense amplifier comprising:
a first circuit coupled to a bit line of a memory cell, the first circuit configured to bias the bit line to a first bit line bias voltage to inhibit the memory cell from being programmed; and
a second circuit coupled to the bit line of the memory cell, the second circuit configured to bias the bit line to a second bit line bias voltage to program the memory cell,
wherein the second bit line bias voltage is one of a plurality of bit line bias voltages, the second bit line bias voltage configured based on a target data state of the memory cell, and
wherein the second bit line bias voltage is based on a voltage difference between an intermediate state distribution and a target state distribution.

17. The sense amplifier of claim 16, wherein the second circuit comprises:
an input terminal coupled to an input signal voltage;
a first transistor comprising a first threshold voltage, a first control terminal coupled to the input terminal, and a second terminal; and
a second transistor comprising a second threshold voltage, a second control terminal coupled to the second terminal and a third terminal coupled to the bit line,
wherein the second bit line bias voltage equals the input signal voltage minus the first threshold voltage and the second threshold voltage.

18. The sense amplifier of claim 16, wherein a number of the plurality of bit line bias voltages equals a number of data states that may be stored in the memory cell.

19. The sense amplifier of claim 16, wherein the plurality of bit line voltages comprises four bit line voltages.

20. The sense amplifier of claim 16, wherein the plurality of bit line voltages comprises a first bit line bias voltage of about 0V, a second bit line bias voltage of about 0.4V, a third bit line bias voltage of about 0.8V, and a fourth bit line bias voltage of about 1.2V.

21. The sense amplifier of claim 16, wherein the non-volatile memory comprises a two-dimensional or a three-dimensional non-volatile memory.

* * * * *